US006808820B2

(12) United States Patent
Lee et al.

(10) Patent No.: US 6,808,820 B2
(45) Date of Patent: Oct. 26, 2004

(54) MULTILAYER CONTAINERS AND PREFORMS HAVING BARRIER PROPERTIES UTILIZING RECYCLED MATERIAL

(75) Inventors: Robert A. Lee, Bowdon (GB); Gerald A. Hutchinson, Cote de Caza, CA (US)

(73) Assignee: Advanced Plastics Technology Ltd. (GB)

( * ) Notice: Subject to any disclaimer, the term of this patent is extended or adjusted under 35 U.S.C. 154(b) by 0 days.

(21) Appl. No.: 09/949,413

(22) Filed: Sep. 5, 2001

(65) Prior Publication Data

US 2002/0090473 A1 Jul. 11, 2002

Related U.S. Application Data

(60) Provisional application No. 60/230,611, filed on Sep. 5, 2000.

(51) Int. Cl.⁷ .................... B29C 45/13; B29C 45/14; B32B 1/08; B32B 27/36; B65D 1/00
(52) U.S. Cl. ............... 428/480; 428/35.7; 428/542.8; 428/903.3; 428/913
(58) Field of Search ................. 428/35.7, 480, 428/542.8, 903.3, 913, 36.6, 36.7, 475.2, 413

(56) References Cited

U.S. PATENT DOCUMENTS

| 3,224,043 A | 12/1965 | Lameris et al. |
| 3,305,528 A | 2/1967 | Wynstra et al. |

(List continued on next page.)

FOREIGN PATENT DOCUMENTS

| DE | 2108774 | 9/1971 |
| DE | 26 49 640 | 5/1978 |

(List continued on next page.)

OTHER PUBLICATIONS

Patent Abstracts of Japan; Publn. No: 58092536, published Jan. 6, 1983 entitled Biaxially Stretched Plastic Bottle, in the name of Shimojima Kohei and assigned to Toyo Seikan Kaisha Ltd.

(List continued on next page.)

*Primary Examiner*—Sandra M. Nolan
(74) *Attorney, Agent, or Firm*—Knobbe Martens Olson & Bear LLP

(57) ABSTRACT

Preferred embodiments relate to methods and apparatus for making articles made of polyester, preferably virgin polyethylene terephthalate (PET), having coated directly to at least one of the surfaces thereof one or more layers of recycled or post-consumer PET and one or more layers of a material with good gas-barrier characteristics, preferably silicon oxide. Preferably, the recycled PET layer comprises about 25% to about 50% of the entire material content. Preferably the articles take the form of preforms and the containers are blow-molded therefrom and the barrier layer is subsequently applied. The preferred barrier materials have a lower permeability to oxygen and carbon dioxide than PET. In addition, the neck of the preforms and bottles is at least partially in the crystalline state and the body is primarily in the amorphous or semi-crystalline state. This structure in a preform enables the preform to be easily blow molded by virtue of the amorphous material in the body, while being able to have dimensional stability in hot-fill applications.

22 Claims, 15 Drawing Sheets

U.S. PATENT DOCUMENTS

| | | |
|---|---|---|
| 3,317,471 A | 5/1967 | Johnson et al. |
| 3,395,118 A | 7/1968 | Reining et al. |
| 3,482,284 A | 12/1969 | Rees |
| 3,632,267 A | 1/1972 | Kader |
| 3,719,735 A | 3/1973 | Valyi |
| 3,740,181 A | 6/1973 | Uhlig |
| 3,813,198 A | 5/1974 | Valyi |
| 3,819,314 A | 6/1974 | Marcus |
| 3,857,660 A | 12/1974 | Flynn et al. |
| 3,869,056 A | 3/1975 | Valyi |
| 3,878,282 A | 4/1975 | Bonis |
| 3,882,213 A | 5/1975 | Uhlig |
| 3,944,643 A | 3/1976 | Sato et al. |
| 3,947,176 A | 3/1976 | Rainville |
| 3,963,399 A | 6/1976 | Zavasnik |
| 3,966,378 A | 6/1976 | Valyi |
| 4,040,233 A | 9/1977 | Valyi |
| 4,061,705 A | 12/1977 | Marcus |
| 4,065,246 A | 12/1977 | Marcus |
| 4,079,851 A | 3/1978 | Valyi |
| 4,092,391 A | 5/1978 | Valyi |
| 4,116,606 A | 9/1978 | Valyi |
| 4,145,392 A | 3/1979 | Valyi |
| 4,149,645 A | 4/1979 | Valyi |
| 4,151,247 A | 4/1979 | Hafele |
| 4,151,248 A | 4/1979 | Valyi |
| 4,213,751 A | 7/1980 | Fernandez |
| 4,323,341 A | 4/1982 | Valyi |
| 4,357,296 A | 11/1982 | Hafele |
| 4,375,947 A | 3/1983 | Marcus |
| 4,376,090 A | 3/1983 | Marcus |
| 4,378,963 A | 4/1983 | Schouenberg |
| 4,403,090 A | 9/1983 | Smith |
| 4,438,254 A | 3/1984 | Doorakian et al. |
| 4,480,082 A | 10/1984 | McLean et al. |
| 4,515,836 A | 5/1985 | Cobbs, Jr. et al. |
| 4,538,542 A | 9/1985 | Kennon et al. |
| 4,540,543 A | 9/1985 | Thomas et al. |
| 4,560,741 A | 12/1985 | Davis et al. |
| 4,564,541 A | 1/1986 | Taira et al. |
| 4,569,869 A | 2/1986 | Kushida et al. |
| 4,573,596 A | 3/1986 | Slat |
| 4,578,295 A | 3/1986 | Jabarin |
| 4,587,073 A | 5/1986 | Jakobsen |
| 4,590,021 A | 5/1986 | Ota et al. |
| 4,604,044 A | 8/1986 | Hafele |
| 4,604,258 A | 8/1986 | Valyi |
| 4,615,925 A | 10/1986 | Nilsson |
| 4,646,925 A | 3/1987 | Nohara |
| 4,647,648 A | 3/1987 | Silvis et al. |
| 4,699,809 A | 10/1987 | Maruhashi et al. |
| 4,715,504 A | 12/1987 | Chang et al. |
| 4,741,936 A | 5/1988 | Nohara et al. |
| 4,755,404 A | 7/1988 | Collette |
| 4,818,575 A | 4/1989 | Hirata et al. |
| 4,830,811 A | 5/1989 | Aoki |
| 4,847,129 A | 7/1989 | Collette et al. |
| 4,867,664 A | 9/1989 | Fukuhara |
| 4,871,410 A | 10/1989 | Bonnebat et al. |
| 4,937,130 A | 6/1990 | Clagett et al. |
| 4,940,616 A | 7/1990 | Yatsu et al. |
| 4,956,143 A | 9/1990 | McFarlane |
| 4,980,211 A | 12/1990 | Kushida |
| 5,006,381 A | 4/1991 | Nugent, Jr. et al. |
| 5,077,111 A | 12/1991 | Collette |
| 5,085,821 A | 2/1992 | Nohara |
| 5,089,588 A | 2/1992 | White et al. |
| 5,094,793 A | 3/1992 | Schrenk et al. |
| 5,115,075 A | 5/1992 | Brennan et al. |
| 5,134,218 A | 7/1992 | Brennan et al. |
| 5,143,998 A | 9/1992 | Brennan et al. |
| 5,149,768 A | 9/1992 | White et al. |
| 5,188,787 A | 2/1993 | King et al. |
| 5,202,074 A | 4/1993 | Schrenk et al. |
| 5,246,751 A | 9/1993 | White et al. |
| 5,275,853 A | 1/1994 | Silvis et al. |
| RE34,537 E | 2/1994 | Dyrup |
| 5,300,326 A | 4/1994 | Zezinka et al. |
| 5,300,541 A | 4/1994 | Nugent, Jr. et al. |
| 5,302,417 A | 4/1994 | Yamauchi et al. |
| 5,354,532 A | 10/1994 | Nakai et al. |
| 5,411,698 A | 5/1995 | Mero et al. |
| 5,443,378 A | 8/1995 | Jaroschek et al. |
| 5,443,766 A | 8/1995 | Slat et al. |
| 5,464,106 A | 11/1995 | Slat et al. |
| 5,472,753 A | 12/1995 | Farha |
| 5,489,455 A | 2/1996 | Nugent, Jr. et al. |
| 5,491,204 A | 2/1996 | Nugent, Jr. et al. |
| 5,508,076 A | 4/1996 | Bright |
| 5,509,965 A | 4/1996 | Harry et al. |
| 5,540,878 A | 7/1996 | Schrenk et al. |
| 5,551,858 A | 9/1996 | Yoshizawa et al. |
| 5,571,470 A | 11/1996 | Plester |
| 5,582,788 A | 12/1996 | Collette et al. |
| 5,599,494 A | 2/1997 | Marcus |
| 5,628,950 A | 5/1997 | Schrenk et al. |
| 5,628,957 A | 5/1997 | Collette et al. |
| 5,639,848 A | 6/1997 | Nugent, Jr. et al. |
| 5,645,183 A | 7/1997 | Slat et al. |
| 5,651,933 A | 7/1997 | Slat et al. |
| 5,652,034 A | 7/1997 | Seiner |
| 5,676,267 A | 10/1997 | Slat et al. |
| 5,688,570 A | 11/1997 | Ruttinger |
| 5,688,572 A | 11/1997 | Slat et al. |
| 5,728,439 A | 3/1998 | Carlblom |
| 5,731,094 A | 3/1998 | Brennan et al. |
| 5,759,653 A | 6/1998 | Collette et al. |
| 5,759,654 A | 6/1998 | Cahill |
| 5,759,656 A | 6/1998 | Collette et al. |
| 5,772,056 A | 6/1998 | Slat |
| 5,780,128 A * | 7/1998 | Farha .................. 428/35.7 |
| 5,804,305 A | 9/1998 | Slat et al. |
| 5,834,078 A | 11/1998 | Cavitt et al. |
| 5,837,339 A | 11/1998 | Wood et al. |
| 5,894,023 A | 4/1999 | Schramm et al. |
| 5,906,285 A | 5/1999 | Slat |
| 5,906,787 A | 5/1999 | Plester |
| 5,914,138 A | 6/1999 | Swenson |
| 5,927,525 A | 7/1999 | Darr et al. |
| 5,968,620 A | 10/1999 | Harvey et al. |
| 5,972,445 A | 10/1999 | Kimura et al. |
| 5,989,661 A | 11/1999 | Krishnakumar et al. |
| 6,051,294 A | 4/2000 | White et al. |
| 6,068,900 A | 5/2000 | Kohn et al. |
| 6,090,460 A | 7/2000 | Collette et al. |
| 6,123,211 A | 9/2000 | Rashid et al. |
| 6,136,354 A | 10/2000 | Wood et al. |
| 6,168,740 B1 | 1/2001 | Koch et al. |
| 6,180,715 B1 | 1/2001 | Schmidt |
| 6,194,043 B1 | 2/2001 | Fehn |
| 6,312,641 B1 | 11/2001 | Hutchinson |
| 6,319,574 B1 | 11/2001 | Slat |
| 6,352,426 B1 | 3/2002 | Hutchinson et al. |
| 6,365,247 B1 * | 4/2002 | Cahill et al. .............. 428/35.7 |
| 6,372,318 B1 | 4/2002 | Collette et al. |
| 6,391,408 B1 | 5/2002 | Hutchinson |
| 6,428,737 B1 | 8/2002 | Collette et al. |
| 6,461,697 B1 | 10/2002 | Slat et al. |
| 6,485,804 B1 | 11/2002 | Nakamachi et al. |
| 6,524,672 B1 | 2/2003 | Slat et al. |
| 6,676,883 B2 | 1/2004 | Hutchinson et al. |

| | | | | |
|---|---|---|---|---|
| 2001/0030163 A1 | 10/2001 | Rashid et al. | EP | 0 678 554 A1 | 10/1995 |
| 2002/0001686 A1 | 1/2002 | Kashiba et al. | EP | 0 689 933 A2 | 1/1996 |
| 2002/0028870 A1 | 3/2002 | Lan et al. | EP | 0 767 049 A2 | 10/1996 |
| 2002/0048682 A1 | 4/2002 | Subramanian et al. | EP | 0 774 491 A2 | 11/1996 |
| 2002/0061371 A1 | 5/2002 | Schmidt et al. | EP | 0 756 931 A2 | 2/1997 |
| 2002/0090473 A1 | 7/2002 | Lee et al. | EP | 0 756 931 A | 2/1997 |
| 2002/0155236 A1 | 10/2002 | Cahill et al. | EP | 0 653 982 B1 | 9/1997 |
| 2003/0001315 A1 | 1/2003 | Hutchinson et al. | EP | 0 794 007 A1 | 9/1997 |
| 2003/0012904 A1 | 1/2003 | Hutchison et al. | EP | 0 822 213 A1 | 2/1998 |
| 2003/0031814 A1 | 2/2003 | Hutchinson et al. | EP | 0 822 213 A | 2/1998 |
| 2003/0039779 A1 | 2/2003 | Share et al. | EP | 0 894 604 A1 | 2/1999 |
| 2003/0219555 A1 * | 11/2003 | Hutchinson et al. ....... 428/35.7 | EP | 0 937 304 A | 8/1999 |

FOREIGN PATENT DOCUMENTS

| | | | | | |
|---|---|---|---|---|---|
| | | | EP | 0 964 031 A2 | 12/1999 |
| | | | EP | 0 837 763 B1 | 12/2001 |
| DE | 30 44 930 A1 | 10/1981 | FR | 2538297 | 6/1984 |
| DE | 3407 060 C2 | 4/1986 | GB | 1482956 | 8/1977 |
| DE | 3518 441 C2 | 3/1987 | GB | 2011309 A | 7/1979 |
| DE | 3518 875 C2 | 9/1989 | JP | 55-37335 | 3/1980 |
| DE | 3121 420 C2 | 3/1990 | JP | 57093126 | 6/1982 |
| DE | 3121 421 C2 | 8/1990 | JP | 57-93126 | 10/1982 |
| DE | 298 620 A5 | 3/1992 | JP | 61002519 | 1/1986 |
| DE | 196 40 662 C1 | 3/1998 | JP | 61185417 | 8/1986 |
| EP | 0 019 438 A1 | 11/1980 | JP | 04197634 | 7/1992 |
| EP | 0 100 375 A2 | 9/1982 | JP | 08281892 | 10/1996 |
| EP | 0 073151 A2 | 3/1983 | JP | 11090975 A * | 4/1999 |
| EP | 0 212 339 B1 | 4/1983 | JP | 106219 | 4/2001 |
| EP | 0 095 909 B1 | 5/1983 | WO | WO 87/02680 | 10/1986 |
| EP | 0 099 727 A2 | 7/1983 | WO | WO 87/05276 | 9/1987 |
| EP | 0 105 826 B1 | 7/1983 | WO | WO 89/08556 | 9/1989 |
| EP | 0 571 116 A1 | 10/1983 | WO | WO 90/07553 | 7/1990 |
| EP | 0 092 979 B1 | 11/1983 | WO | WO 93/01988 | 7/1991 |
| EP | 0 096 581 B1 | 12/1983 | WO | WO 92/01558 | 2/1992 |
| EP | 0 126 575 A2 | 5/1984 | WO | WO 93/07068 | 4/1993 |
| EP | 0 118 226 B2 | 9/1984 | WO | WO 93/25835 | 12/1993 |
| EP | 0 125 107 A1 | 11/1984 | WO | WO 94/01268 | 1/1994 |
| EP | 0 156 085 B1 | 11/1984 | WO | WO 95/06680 | 8/1994 |
| EP | 0 174 265 A2 | 3/1985 | WO | WO 94/19186 | 9/1994 |
| EP | 0 171 161 B1 | 6/1985 | WO | WO 94/25366 | 11/1994 |
| EP | 0 153 120 B1 | 8/1985 | WO | WO 95/00325 | 1/1995 |
| EP | 0 153 894 B1 | 9/1985 | WO | WO 95/07219 | 3/1995 |
| EP | 0 160 984 B1 | 11/1985 | WO | WO 95/18002 | 6/1995 |
| EP | 0 176 229 B1 | 4/1986 | WO | WO 95/22451 | 8/1995 |
| EP | 0 180 191 B1 | 5/1986 | WO | WO 95/29805 | 11/1995 |
| EP | 0 191 701 A2 | 8/1986 | WO | WO 95/34425 | 12/1995 |
| EP | 0 199 633 B1 | 10/1986 | WO | WO 96/18685 | 12/1995 |
| EP | 0 203 630 A2 | 12/1986 | WO | WO 97/28218 | 2/1996 |
| EP | 0 215 630 B1 | 3/1987 | WO | WO 96/35571 | 3/1996 |
| EP | 0 218 245 B1 | 4/1987 | WO | WO 96/33062 | 4/1996 |
| EP | 0 225 049 A2 | 6/1987 | WO | WO 96/20074 | 7/1996 |
| EP | 0 266 900 A2 | 5/1988 | WO | WO 97/09366 | 8/1996 |
| EP | 0 278 403 B1 | 8/1988 | WO | WO 97/02939 | 1/1997 |
| EP | 0 280 736 A1 | 9/1988 | WO | WO 97/09366 A1 | 3/1997 |
| EP | 0 287 839 A2 | 10/1988 | WO | WO 97/26127 | 7/1997 |
| EP | 0 325 030 A2 | 11/1988 | WO | WO 97/28218 A1 | 8/1997 |
| EP | 0 302 117 A1 | 2/1989 | WO | WO 97/34758 | 9/1997 |
| EP | 0 306 675 B1 | 3/1989 | WO | WO 97/40972 | 11/1997 |
| EP | 0 341 044 B1 | 3/1989 | WO | WO 97/40981 | 11/1997 |
| EP | 0 350 745 A2 | 1/1990 | WO | WO 97/42250 | 11/1997 |
| EP | 0 395 237 A1 | 4/1990 | WO | WO 97/42250 A1 | 11/1997 |
| EP | 0 351 118 A2 | 5/1990 | WO | WO 97/43182 | 11/1997 |
| EP | 0 368 278 A2 | 5/1990 | WO | WO 97/44174 | 11/1997 |
| EP | 0 376 469 B1 | 7/1990 | WO | WO 97/47695 | 12/1997 |
| EP | 0 462 455 A1 | 6/1991 | WO | WO 98 02479 | 1/1998 |
| EP | 0 524 572 B1 | 7/1992 | WO | WO 98/02479 A1 | 1/1998 |
| EP | 0 544 545 A1 | 11/1992 | WO | WO 98/17470 A1 | 4/1998 |
| EP | 0 518 703 A2 | 12/1992 | WO | WO 98/17470 | 4/1998 |
| EP | 0 518 703 A3 | 12/1992 | WO | WO 98/21730 | 5/1998 |
| EP | 0 583 953 A1 | 12/1993 | WO | WO 98/46410 | 10/1998 |
| EP | 0 581 970 A1 | 2/1994 | WO | WO 99/20462 | 4/1999 |
| EP | 0 387 614 B1 | 6/1994 | WO | WO 99/43563 | 9/1999 |
| EP | 0 671 251 A1 | 9/1995 | WO | WO 99/61514 | 12/1999 |

| | | |
|---|---|---|
| WO | WO 00/62998 | 10/2000 |
| WO | WO 01/83193 A1 | 11/2001 |
| WO | WO 02/20246 A1 | 3/2002 |

OTHER PUBLICATIONS

Proceedings of $3^{rd}$ International Conference on Rigid Polyester Packaging Innovations for Food and Beverages; Nova-Pak Americas '98; Jan. 26–27, 1998.

White et al.; "High–Barrier Structural Thermoplastics Based on Diglycidyl Ethers"; Polymer Science; vol. 34(1); 1993; pp. 904–905.

"Mitsui B–010:Gas Barrier Polyester"; Chemical Data Sheet; Mitsui Chemicals, Inc.; Feb. 1, 1998.

Patent Abstracts of Japan vol. 006, No. 184 (M–157), Sep. 21, 1982 & JP 57 093126 A (Sumitomo Heavy Ind Ltd), Jun. 10, 1982 abstract.

Patent Abstracts of Japan vol. 1997, No. 02 Feb. 28, 1997 & JP 08 281892 A (Mitsubishi Plastics Ind Ltd), Oct. 29, 1996 abstract.

Database WPI Section Ch, Week 199533 Derwent Publications Ltd., London, GB AN 1995–251427 XP002150645 & JP 07 156349 A (Kureha Chem Ind Co Ltd), Jun. 20, 1995 abstract.

Patent Abstracts of Japan vol. 016, No. 529 (M–1332), Oct. 29, 1992 & JP 04197634 A (Kao Corp), Jul. 17, 1992 abstract.

Database WPI Section Ch, Week 199805 Derwent Publications Ltd., London, GB, AN 1998–047013 XP002150646 & JP 09 0296056 A (Nipon Ester Co Ltd), Nov. 18, 1997 abstract.

The Condensed Chemical Dictionary, 1981, p. 65.

Yukihiko Suematsu; Growth Prospects & Challenges for Pet in Asia/Japan: A Producer's Perspective, Pub'd May 19, 1997.

PCT International Search Report: mailed Jan. 28, 2002 for International Application No. PCT/US 01/28128, Filed on Sep. 5, 2001.

U.S. patent application No. 10/614,731, filed on Jul. 3, 2003 in 58 pages with 16 pages of Drawings, Figures 1–18.

U.S. patent application No. 10/705,748, Filed on Nov. 10, 2003 in 60 pages with 16 pages of Drawings, Figures 1–20.

* cited by examiner

MULTILAYER CONTAINERS AND PREFORMS HAVING BARRIER PROPERTIES UTILIZING RECYCLED MATERIAL

PRIORITY INFORMATION

This application claims priority from related, co-pending provisional Application No. 60/230,611 filed Sep. 5, 2000 and application Ser. No. 09/296,695 filed Apr. 21, 1999, the entireties of which are incorporated by reference herein.

BACKGROUND OF THE INVENTION

1. Field of the Invention

Preferred embodiments relate to an apparatus and method for making multi-layer polyesters, preferably comprising virgin polyethylene terephthalate (PET), recycled polyethylene terephthalate (RPET) or post-consumer recycled polyethylene terephthalate (PCR PET), a barrier layer and articles made therefrom. Preferably the multi-layer polyester takes the form of preforms having a barrier layer internally applied to the bottles blow-molded therefrom.

2. Description of the Related Art

The use of plastic containers as a replacement for glass or metal containers in the packaging of beverages has become increasingly popular. The advantages of plastic packaging include lighter weight, decreased breakage as compared to glass, and potentially lower costs. The most common plastic used in making beverage containers today is PET. Virgin PET has been approved by the FDA for use in contact with foodstuffs. Containers made of PET are transparent, thin-walled, lightweight, and have the ability to maintain their shape by withstanding the force exerted on the walls of the container by pressurized contents, such as carbonated beverages. PET resins are also fairly inexpensive and easy to process.

However, the use of strictly virgin materials in the production of plastic containers raises environmental concerns. Both public and governmental pressures have been placed on manufacturers using and producing plastic containers to incorporate post-consumer recycled plastics into their packaging. Additionally, recycled resins are less expensive than their virgin counterparts. Therefore, it is desirable to utilize recycled PET in the production of containers currently being manufactured entirely from virgin PET.

At least two issues have prevented the widespread incorporation of recycled PET in the beverage container industry. First, PET is a naturally crystalline material, that is, if allowed to cool slowly, will orient itself into an organized, crystalline structure. A crystalline structure inhibits the creation of a strong interface between the virgin material and the recycled material, and inhibits blow molding, which can prevent the resulting bottle from being clear and structurally functional.

Secondly, since pet containers can be manufactured by injection molding using only a single injection of PET, manufacture is relatively easy and production cycle time is low. Thus, PET containers are inexpensive. Even if post-consumer recycled PET materials can be bonded to virgin PET to create a saleable container, methods and apparatus for making such containers within a competitive cycle time and cost have not been devised. Production cycle time is especially important because a lower cycle time enables a manufacturer to make more efficient use of its capital equipment. Specifically, a low cycle time enables higher volume and less expensive production of containers.

For a container incorporating recycled material to be commercially feasible, increased costs associated with any increase in cycle time necessary to incorporate the recycled material must be offset by increased content of the recycled material relative to the total material of the container. The additional recycled material replaces a similar amount of virgin material and is less expensive, therefore recovering at least a portion of the costs of slower production. Current techniques limit recycled content to about 10%, which is generally not enough to recoup the costs of increased cycle time. It is desirable to incorporate at least 25%–50% recycled material to in order to at least "break even" in terms of any increase in cycle time. It is also desirable to minimize cycle time increases associated with incorporating recycled material. Therefore, a need exists for a relatively low cycle time and a high recycled material content production method and apparatus to provide a viable alternative to monolayer, virgin PET containers.

Further, assuming an acceptable PET/PCR PET container can be produced within a reasonable cycle time, there is an additional downside to the use of PET in thin-walled beverage containers: permeability to gases such as carbon dioxide and oxygen. The permeability of PET bottles results in soft drinks that go "flat" due to the egress of carbon dioxide, as well as beverages that have their flavor spoiled due to the ingress of oxygen. Thus, it would also be preferable to provide gas barrier protection to the PET/PCR PET preform or container.

However, existing multi-layer preforms and containers are not compatible with the processes employed to add a barrier layer. For example, a preform to which a barrier layer is added is likely to delaminate upon blow-molding. Similarly, existing multi-layer containers suffer from warping and/or delamination due to the heat or vacuum conditions associated with typical barrier coating processes.

In addition, as mentioned previously, an amorphous or semi-crystalline state is preferred to allow for blow molding of the PET preform, with or without recycled content. However, such bottles may not have enough dimensional stability to withstand a hot-fill process due to the relatively low Tg of the PET material and the tight tolerances required when using standard threaded closures. In these circumstances, a bottle made of semi-crystalline or crystalline PET would be preferred, as it would hold its shape during warm-fill and hot-fill processes.

Thus, the need exists for an apparatus and method for making recycled material content PET preforms and containers which are economical, cosmetically appealing, and have good barrier and physical properties, and are able to maintain dimensional stability during a hot-fill process remains unfulfilled.

SUMMARY OF THE PREFERRED EMBODIMENTS

Preferred embodiments relate to methods and apparatus for making PET articles containing a significant percentage by weight of recycled PET and having coated upon the surfaces thereof one or more thin layers of a material approved for contact with foodstuffs and having good gas-barrier characteristics. The articles are preferably in the form of preforms and containers having the uppermost portion in a crystalline state, while keeping the body of the preform or container amorphous or semi-crystalline. Additionally, the containers may be heat-set after blow molding.

Preferred methods and apparatus allow for the manufacture of a beverage container utilizing a significant amount of post-consumer recycled material, having good gas-barrier properties and dimensional stability during a hot-fill process, while maintaining a competitive cost and cycle time with existing technology using solely virgin materials. The production of beverage containers using apparatus and methods disclosed herein may greatly reduce the amount of virgin material required for packaging needs, while additionally providing for the utilization of post-consumer recycled materials.

One preferred embodiment is a laminate including a virgin PET layer and a recycled PET layer adhered directly to the virgin PET layer. Additionally, the laminate comprises a gas barrier layer. The recycled layer comprises about 25% to about 50% of the laminate.

In another aspect of a preferred embodiment there is provided preform or container including a threaded neck finish and a body portion. The body portion includes an end cap. The neck finish and the body portion comprise a first layer. The body portion additionally comprises a second layer. The first layer comprises virgin polyester and the second layer comprises recycled polyester. The second layer comprises about 25% to about 50% of the preform. A third layer of a gas barrier material is applied to one of the first and second layers.

In a further aspect of preferred embodiments, a method is disclosed of making a preform having a threaded neck finish, a neck cylinder and a body portion including an end cap, where a second layer of material is disposed on the body portion and comprises recycled or post-consumer PET. The method includes injecting a polyester melt into a cavity formed by a mold and a core wherein the mold comprises a threaded neck finish portion and a body portion. The threaded neck portion is at a first temperature and the body portion at a second temperature, wherein the first temperature is greater than the crystallinity temperature of the polyester and the second temperature is less than the crystallinity temperature of the polyester. The method further includes leaving the polyester melt in contact with the mold and core to form a preform wherein the body portion is primarily amorphous or semi-crystalline, and the threaded neck finish is primarily crystalline. The method additionally includes removing the preform from the mold placing the preform in a second mold wherein the second mold comprises a threaded neck finish portion at the first temperature and a body portion at the third temperature. The method also includes injecting a melt of the recycled PET material over the body portion to form a two-layer preform and removing the two-layer preform from the mold.

For purposes of summarizing preferred embodiments and the advantages achieved over the prior art, certain objects and advantages of the preferred embodiments have been described hereinabove. Of course, it is to be understood that not necessarily all such objects or advantages may be achieved in accordance with any particular embodiment. Thus, for example, those skilled in the art will recognize that preferred embodiments may be carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments become readily apparent to those skilled in the art from the following detailed description of the preferred embodiments having reference to the attached figures, the invention not being limited to any particular preferred embodiment(s) disclosed.

DETAILED DESCRIPTION OF THE PREFERRED EMBODIMENTS

General Description of the Preferred Embodiments

Figure 1:
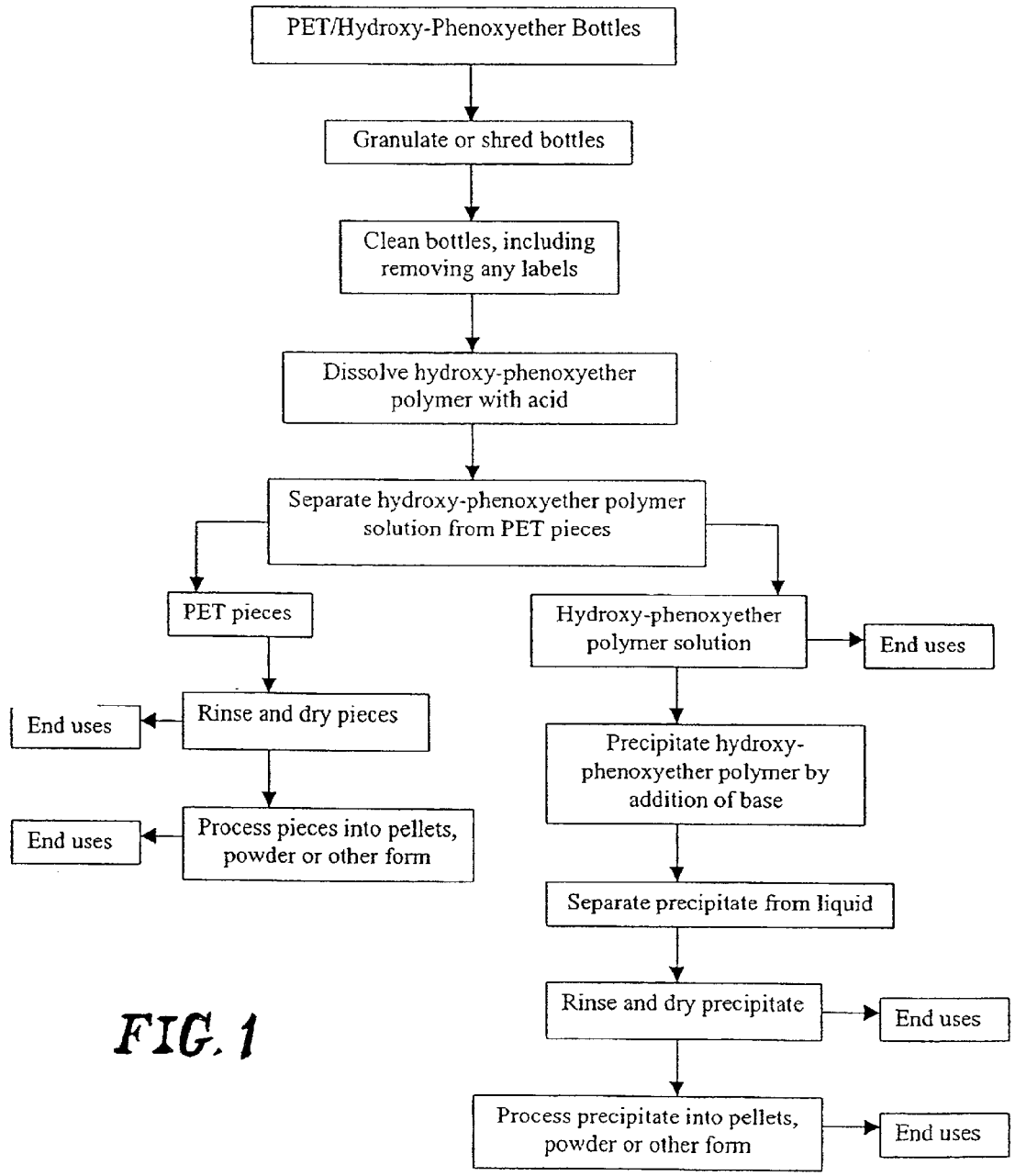
FIG. 1 is a flowchart of a recycling process used to obtain recycled PET for use in preferred embodiments.

Preferred embodiments relate to methods and apparatus for making plastic articles comprising at least one layer of a virgin thermoplastic material and one layer of a recycled thermoplastic material, the end product additionally comprising a barrier material with good gas-barrier characteristics. As presently contemplated, one embodiment of multi-layer article is a bottle of the type used for beverages. Alternatively, embodiments of the multi-layer articles could take the form of laminate sheets, jars, tubs, trays, or bottles for holding liquid foods. In addition, embodiments of the multi-layer articles may be used for medical or pharmaceutical needs, or other applications requiring gas-barrier properties. A laminate constructed in accordance with preferred embodiments may be produced by overmolding or inject-over-inject (IOI) technology described herein, by laminating or co-extrusion, or by other methods suitable to produce a laminate. However, for the sake of simplicity, these embodiments will be described herein primarily in the context of preforms and beverage bottles made from the preforms by blow-molding processes.

Furthermore, the preferred embodiments are described herein specifically in relation to polyethylene terephthalate (PET) but it is applicable to many other thermoplastics of the polyester type. Examples of such other materials include polyethylene 2,6- and 1,5-naphthalate (PEN), PETG, polytetramethylene 1,2-dioxybenzoate and copolymers of ethylene terephthalate and ethylene isophthalate.

When used herein, "recycled" refers to a broad category of materials that have been reprocessed. "Post-consumer recycled" refers to materials which have been recovered after commercial use. Recycled materials include post-consumer recycled materials in addition to materials that have been recovered at any other point during processing or use.

In especially preferred embodiments, "high IPA PET" is used as the polyester which is then coated with a recycled material. As it is used herein, the term "high-IPA PET" refers to PET to which IPA was added during to manufacture to form a copolymer in which the IPA content is more than about 2% by weight, preferably 2–10% IPA by weight, more preferably 3–8%, most preferably about 4–5% IPA by weight. The most preferred range is based upon current FDA regulations, which do not allow for PET materials having an IPA content of more than 5% to be in contact with food or drink. If such regulations are not a concern, then an IPA content of 5–10% is preferred. As used herein, "PET" includes "high IPA PET."

The high-IPA PET (more than about 2% by weight) is preferred because the inventor has surprisingly discovered that use of high-IPA PET in the processes for making multi-layer preforms and containers, provides for better interlayer adhesion than is found in those laminates comprising PET with no IPA or low IPA. Additionally, it has been found that interlayer adhesion improves as the IPA content rises. Incorporation of the higher amounts of IPA into the virgin PET results in a decrease in the rate of crystallization of the high IPA PET material as compared to PET homopolymer, or PET having lower amounts of IPA. The decrease in the rate of crystallization allows for the production of PET layers (made of high IPA PET) having a lower level of crystallinity than what is achieved with low-IPA PET or homopolymer PET when they are made into multi-layer preforms by similar procedures. The lower crystallinity of the high-IPA PET is important in reducing crystallinity at the surface of the PET, i.e. the interface between the virgin PET and the recycled PET. Lower crystallinity allows for better adhesion between the layers and also provides for a more transparent container following blow molding of the preform.

"High IPA PET" may also refer to PET in which the IPA content is introduced by a common master batch process. The master batch process generally comprises adding a concentrated material to a carrier material at a certain ratio (called the "let-down" ratio). A melt is then formed of the two materials, resulting in a single material having the concentrate generally interspersed throughout carrier at the let-down ratio. In the present case, a high IPA PET may be master batched with PET containing little or no IPA to produce a resultant PET comprising percentages of IPA as discussed above. In addition, IPA may also be added to the RPET or PCR PET in order to achieve the advantages discussed in relation to virgin PET with IPA.

If desired, a barrier material may be blended with the RPET or PCR PET to provide barrier properties. Preferred barrier materials include Copolyester Barrier Materials and Phenoxy-type Thermoplastics. Other preferred barrier materials include polyamide barrier materials such as Nylon MXD-6 from Mitsubishi Gas Chemical (Japan). Other preferred barrier materials, referred to herein as "Polyamide Blends." Polyamide Blends as used herein shall include those polyamides containing PET or other polyesters, whether such polyester was included by blending, compounding or reacting. Other barrier materials having similar properties may be used in lieu of these barrier materials. For example, the barrier material may take the form of other thermoplastic polymers, such as acrylic resins including polyacrylonitrile polymers, acrylonitrile styrene copolymers, polyamides, polyethylene naphthalate (PEN), PEN copolymers, and PET/PEN blends.

Alternatively, a barrier layer may be added to the preform by an IOI process as described herein, or by other methods suitable to produce a laminate. A barrier layer may also be added to the end container by a suitable process, such as spraying, dipping, chemical deposition or a plasma deposition process, for example.

In carrying out preferred methods to form multi-layer preforms and bottles, an initial preform is coated with at least one additional layer of a recycled material, post-consumer or recycled PET (collectively recycled PET), and/or other compatible recycled thermoplastic materials. A coating layer may comprise a single material, a mix or blend of materials (heterogeneous or homogeneous), an interwoven matrix of two or more materials, or a plurality of microlayers (lamellae) comprised of at least two different materials.

In accordance with one preferred embodiment, the method for obtaining recycled PET is that in FIG. 1, a flow chart showing a preferred process for obtaining recycled hydroxy-phenoxyether polymer and PET from recycled barrier containers made with such materials. Other processes and additional details not necessary to repeat here are disclosed in Applicant's copending application entitled RECYCLING OF ARTICLES COMPRISING HYDROXY-PHENOXYETHER POLYMERS, application Ser. No. 09/742,887 filed Dec. 20, 2000, the entirety of which is hereby incorporated by reference.

As noted in FIG. 1, the first portions of the method relate to preparation of the containers to be recycled. The first step relates to breaking the articles down into smaller pieces or "flakes". Because some of the articles containing materials to be recycled are relatively large or, in the case of some bottles, contain only small openings into their interiors which could complicate processing by hindering the entry and removal of processing liquids, the articles are preferably granulated, chopped, shredded, comminuted, grated, or otherwise made into smaller pieces. The size of such pieces is not important.

The second part of the process is cleaning. The recycled articles often contain dirt, food particles, grease, labels, adhesive, or other items or debris attached to them which should be removed by cleaning. Cleaning may be accomplished by steam treatment in an aspirator, caustic wash, washing with water either with or without cleaning solution, or treatment by solvents or cleaning solutions not in the presence of water. Preferred cleaning solutions are those which do not dissolve the hydroxy-phenoxyether polymers, e.g. those which are neutral or basic in character or not good solvents for the barrier plastic. Following exposure to the cleaning agents, the materials are optionally rinsed and/or dried before proceeding with the process.

Following preparation, the flakes are combined with an aqueous solution containing about 1–50%, more preferably about 5–20% acetic acid by weight. The pH of the solution is preferably below pH 4, more preferably about pH 3.0–3.5 or less. The flakes are combined with the acid solution for a time period sufficient to result in dissolution of the hydroxy-phenoxyether polymer, preferably for about 0.5–5 hours at about 25–95° C. with stirring or agitation.

Following dissolution of the hydroxy-phenoxyether polymer, the hydroxy-phenoxyether polymer solution is separated from the PET flakes. The separation is preferably done by filtration, but may be done by any method capable of separating solids and liquids such as decantation. The hydroxy-phenoxyether polymer acidic solution may be used following separation in the form of a solution. Alternatively, the acidic hydroxy-phenoxyether polymer solution may undergo additional treatment to partially or fully precipitate the hydroxy-phenoxyether polymer from the solution to give a dispersion or solid.

Precipitation, whether partial or complete, is done by addition of one or more basic (alkaline) materials. Preferably, the basic compound is a strong base such as sodium hydroxide or potassium hydroxide in the form of a solution. As the base is added, the pH of the solution will begin to rise. As the pH of the solution approaches pH 4, precipitate may begin to form. As the pH rises above pH 4, the amount of precipitate increases, with more precipitate forming at pH 5 and pH 6, until at about pH 7 at which point precipitation is substantially complete.

Following precipitation, the hydroxy-phenoxyether polymer is separated from the liquid component or mother liquor from which the precipitate formed. The solids may be separated from the liquid by any method capable of separating solids and liquids, preferably filtration or decantation. The hydroxy-phenoxyether polymer precipitate is preferably rinsed to remove any salts or other materials which may deposit on the precipitate from the liquid portions. Preferred rinsing media include water, preferably distilled and/or deionized water, and solvents in which the hydroxy-phenoxyether polymer is insoluble or only marginally soluble, with water being preferred. The rinse water may be heated to aid the dissolution of residues on the precipitate. The precipitate is then dried. Drying may be accomplished by air drying, vacuum drying with or without added heat, oven drying, IR lamp drying, desiccants, or other methods which aid in the evaporation or elimination of water.

The precipitate may be used following drying or it may be processed before use. Further processing of the precipitate prior to use includes, without limitation, pulverization to form a powder and extrusion to form sheets or pellets. Such processing may include the addition of one or more additives. Suitable additives include, without limitation, mold release agents, dyes, and lubricants. The additives may be dry mixed with the hydroxy-phenoxyether polymer or added to a melt of the hydroxy-phenoxyether polymer.

Following separation from the acidic hydroxy-phenoxyether polymer solution, the PET flakes are preferably rinsed with water. The rinse water is preferably deionized and/or distilled, and either neutral or slightly acidic so as to deter precipitation of any hydroxy-phenoxyether polymer onto the PET flakes during rinsing. In accordance with one preferred embodiment, the flakes are first rinsed with an acidic solution having a pH below about pH 4, followed by a second rinse with water having a pH at or near neutral.

Following rinsing, the flakes are preferably dried by any suitable method including air drying, vacuum drying with or without added heat, oven drying, IR lamp drying, desiccants, or any other method which aids in the evaporation or elimination of water. The PET flakes may be used following drying or they may be processed before use. Further processing prior to use includes, without limitation, pulverization to form a powder and extrusion to form sheets or pellets of recycled PET. Such processing may include the addition of one or more additives. Suitable additives include, without limitation, mold release agents, dyes, other polymers, and lubricants. The additives may be dry mixed with the PET flakes or added to a melt of the PET prior to formation into final shape or form.

Figure 2:
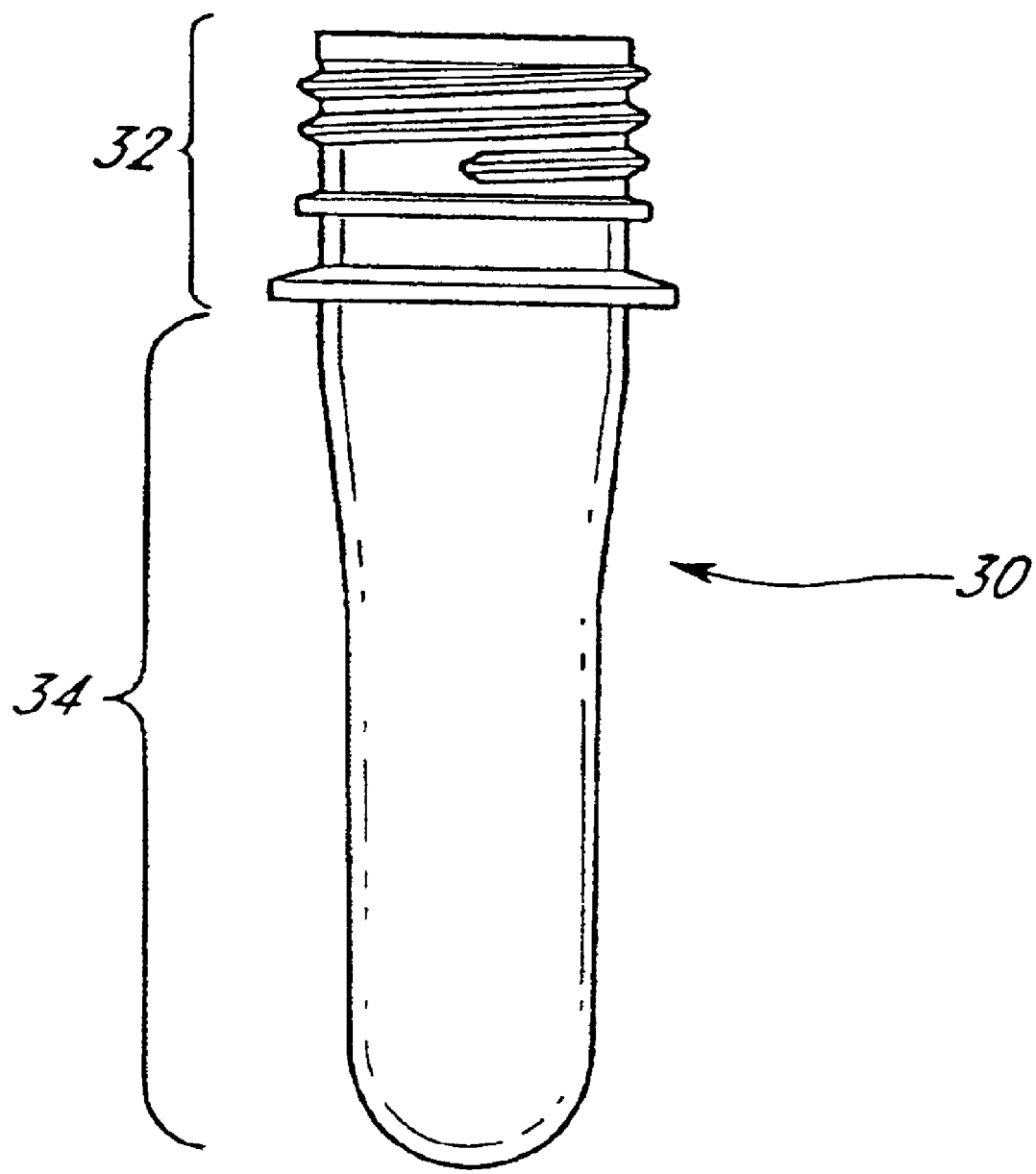
FIG. 2 is an uncoated, virgin material preform as is used as a starting material for embodiments of the present preform.

Referring to FIG. 2, a preferred virgin-layer preform 30 is depicted. The preform is preferably made of an FDA approved material such as virgin PET and can be of any of a wide variety of shapes and sizes. The preform shown in FIG. 2 is of the type which will form a 16 oz. carbonated beverage bottle that requires an oxygen and carbon dioxide barrier, but as will be understood by those skilled in the art, other preform configurations can be used depending upon the desired configuration, characteristics and use of the final article. The virgin-layer preform 30 may be made by injection molding as is known in the art or by methods disclosed herein.

Figure 3:
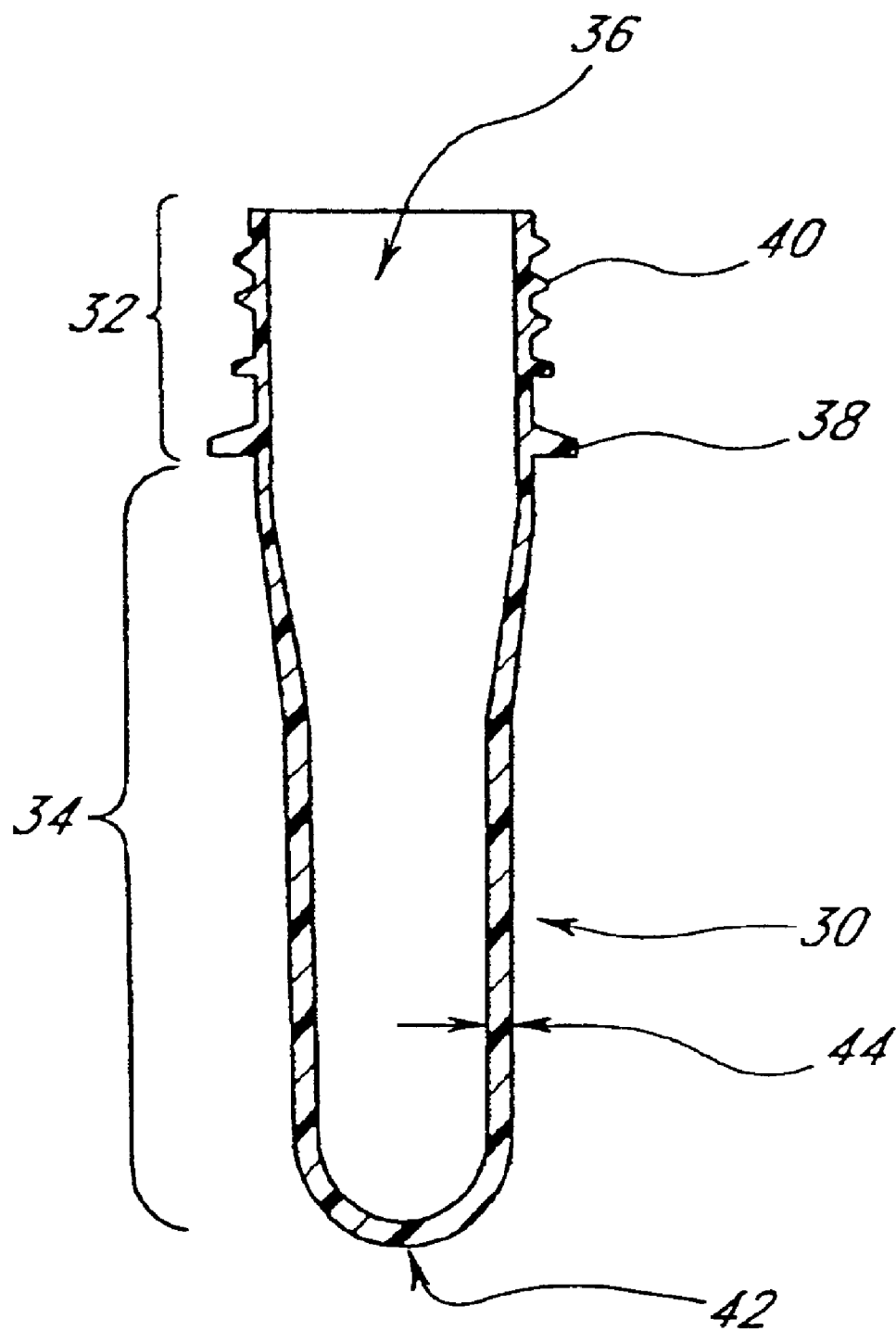
FIG. 3 is a cross-section of a preferred uncoated, virgin material preform of the type that is coated with a recycled material in accordance with a preferred embodiment.

Referring to FIG. 3, a cross-section of the preferred virgin-layer preform 30 of FIG. 2 is depicted. The virgin-layer preform 30 has a neck portion 32 and a body portion 34. The neck portion 32 begins at the opening 36 to the interior of the preform 30 and extends to and includes the support ring 38. The neck portion 32 is further characterized by the presence of the threads 40, which provide a way to fasten a cap for the bottle produced from the preform 30. The body portion 34 is an elongated and cylindrically shaped structure extending down from the neck portion 32 and culminating in the rounded end cap 42. The preform thickness 44 will depend upon the overall length of the preform 30 and the wall thickness and overall size of the resulting container.

Figure 4:
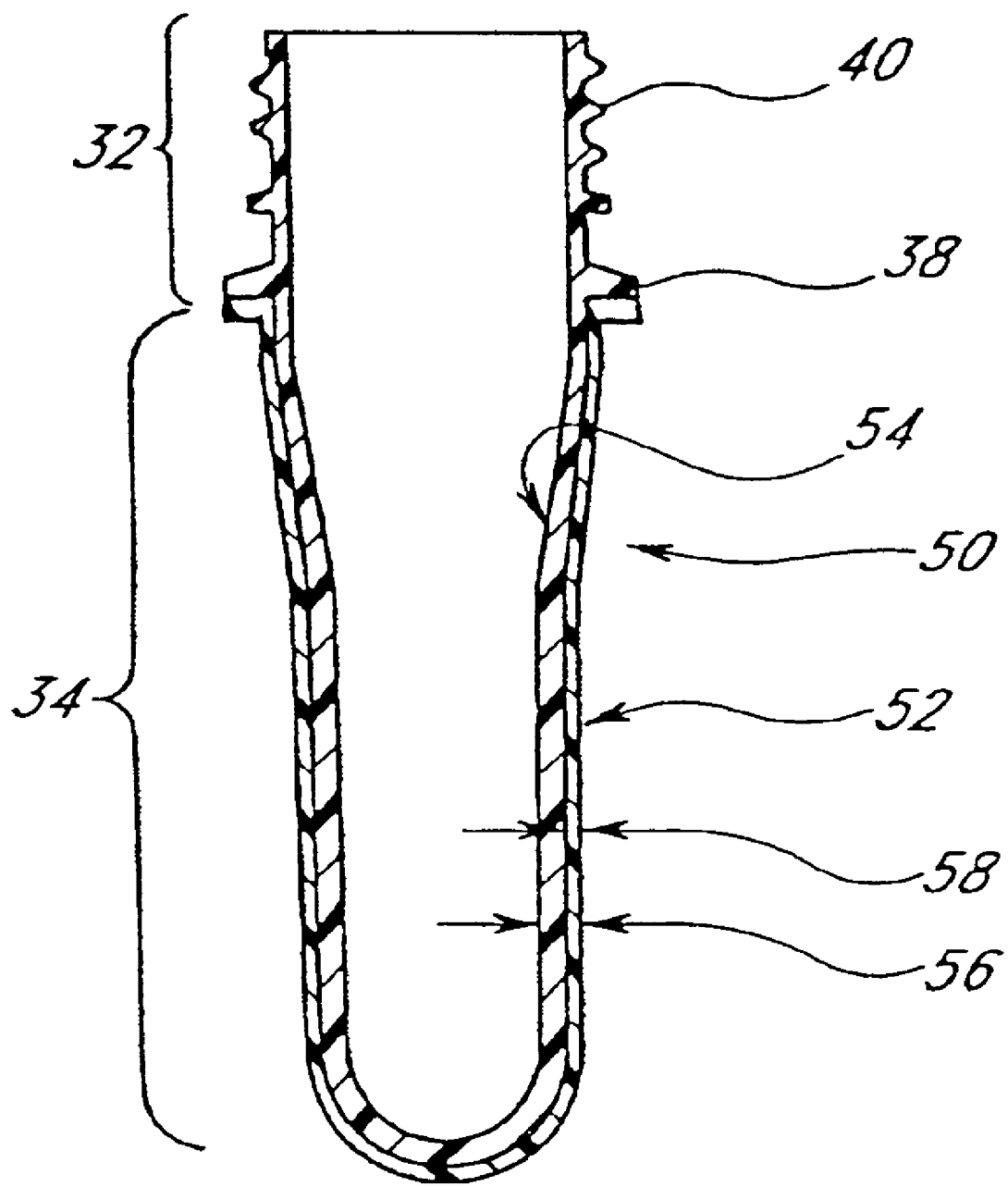
FIG. 4 is a cross-section of one preferred embodiment of a multi-layer preform.

Referring to FIG. 4, a cross-section of one type of multi-layer preform 50 having features in accordance with preferred embodiments is disclosed. The multi-layer preform 50 has a neck portion 32 and a body portion 34 as in the virgin-layer preform 30 in FIGS. 1 and 2. A recycled material layer 52 is disposed about the entire surface of the body portion 34, terminating at the bottom of the support ring 38. The recycled layer 52 in the embodiment shown in the figure does not extend to the neck portion 32, nor is it present on the interior surface 54 of the preform which is preferably made of an FDA approved material such as virgin PET. The recycled coating layer 52 may comprise either a single material or several microlayers of at least two materials. The overall thickness 56 of the preform is equal to the thickness of the initial preform plus the thickness 58 of the recycled layer, and is dependent upon the overall size and desired coating thickness of the resulting container. A preferred preform may contain up to 50% by weight of recycled material. More preferably the preform may contain 25–50% recycled material, and most preferably 50% recycled material content by weight. By way of example, the wall of the bottom portion of the preform may have a thickness of 3.2 millimeters; the wall of the neck finish, a cross-sectional dimension of about 3 millimeters.

Figure 5:
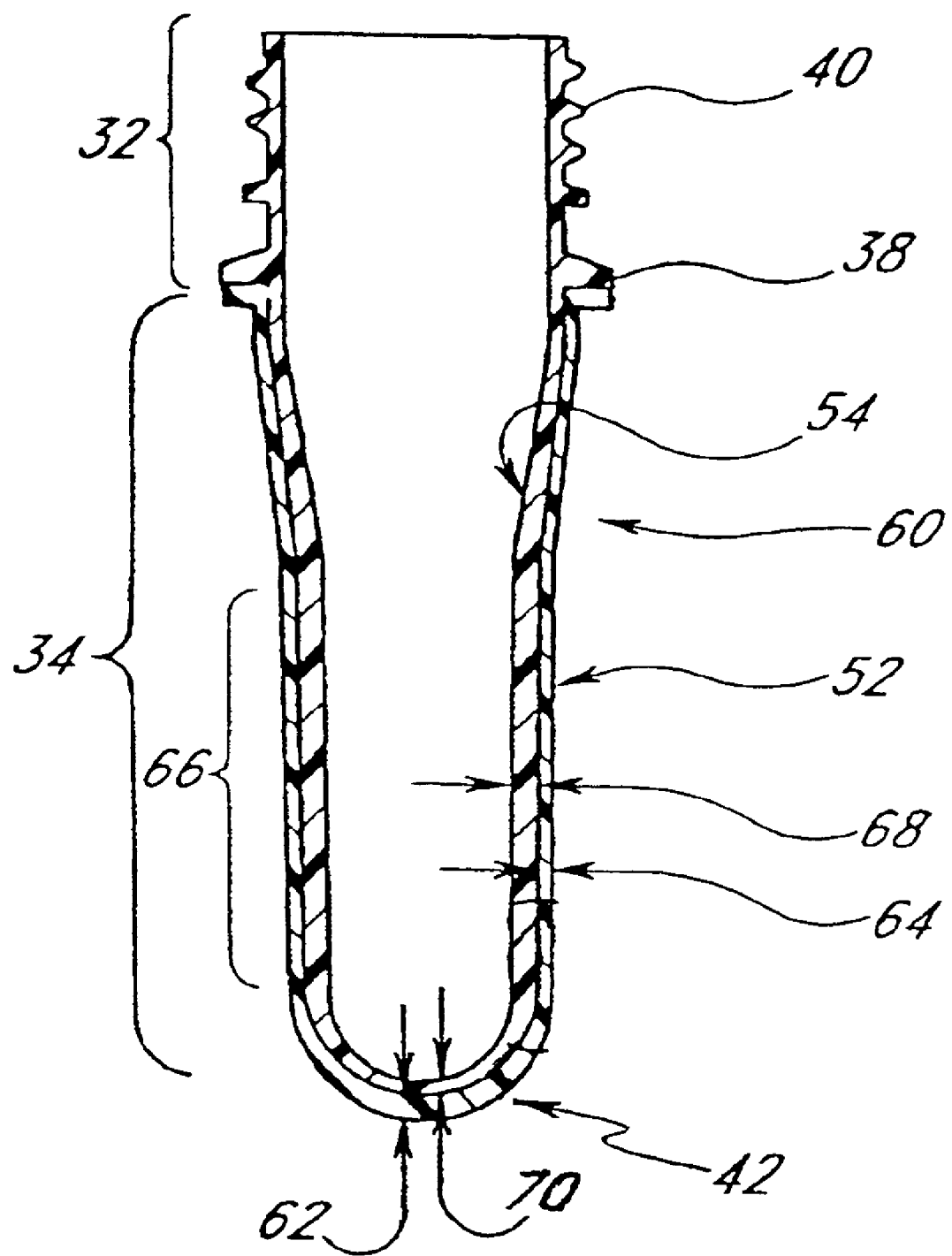
FIG. 5 is a cross-section of another preferred embodiment of a multi-layer preform.

Referring to FIG. 5, a preferred embodiment of a multi-layer preform 60 is shown in cross-section. The primary difference between the multi-layer preform 60 and the multi-layer preform 50 in FIG. 4 is the relative thickness of the two layers in the area of the end cap 42. In multi-layer preform 50, the recycled layer 52 is generally thinner than the thickness of the initial preform throughout the entire body portion of the preform. In multi-layer preform 60, however, the recycled coating layer 52 is thicker at 62 near the end cap 42 than it is at 64 in the wall portion 66, and conversely, the thickness of the inner, virgin polyester layer is greater at 68 in the wall portion 66 than it is at 70, in the region of the end cap 42. This preform design is especially useful when the recycled material coating is applied to the initial preform in an overmolding process to make the multi-layer preform, as described below, where it presents certain advantages including that relating to reducing molding cycle time. These advantages will be discussed in more detail below. The recycled material layer 52 may be homogeneous or it may be comprised of a plurality of microlayers.

The preforms and containers can have layers which have a wide variety of relative thicknesses. In view of the present disclosure, the thickness of a given layer and of the overall preform or container, whether at a given point or over the entire container, can be chosen to fit a coating process or a particular end use for the container. Furthermore, as discussed above in regard to the recycled material layer in FIG. 4, the recycled material layer in the preform and container embodiments disclosed herein may comprise a single material or several microlayers of two or more materials.

Figure 6:
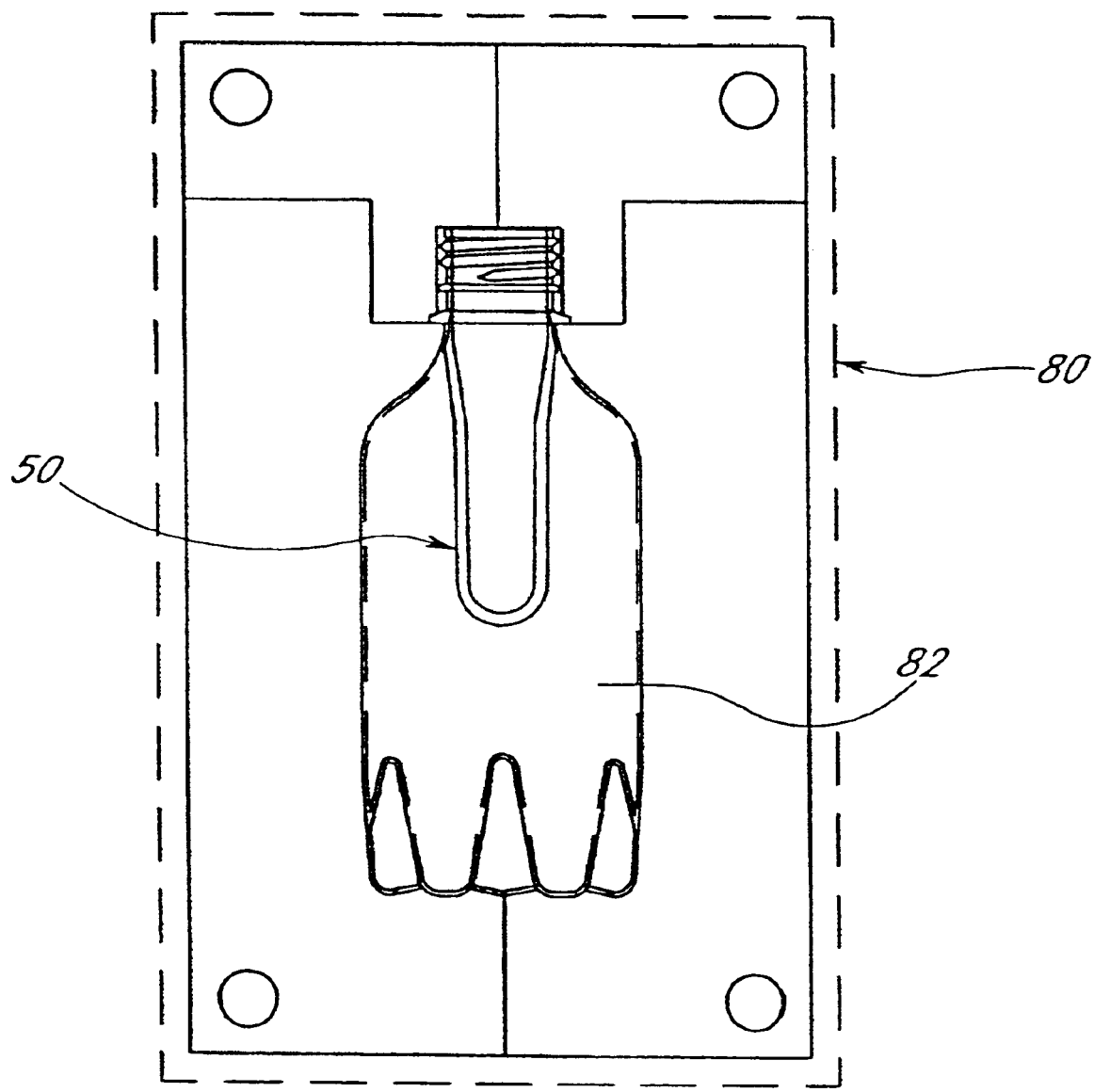
FIG. 6 is a cross-section of a preferred preform in the cavity of a blow-molding apparatus of a type that may be used to make a preferred multi-layer container.

After a multi-layer preform, such as that depicted in FIG. 4, is prepared by a method and apparatus such as those discussed in detail below, it is subjected to a stretch blow-molding process. Referring to FIG. 6, in this process a multi-layer preform 50 is placed in a mold 80 having a cavity corresponding to the desired container shape. The multi-layer preform is then heated and expanded by stretching and by air forced into the interior of the preform 50 to fill the cavity within the mold 80, creating a multi-layer container 82. The blow molding operation normally is restricted to the body portion 34 of the preform with the neck portion 32 including the threads, pilfer ring, and support ring retaining the original configuration as in the preform.

Figure 7:
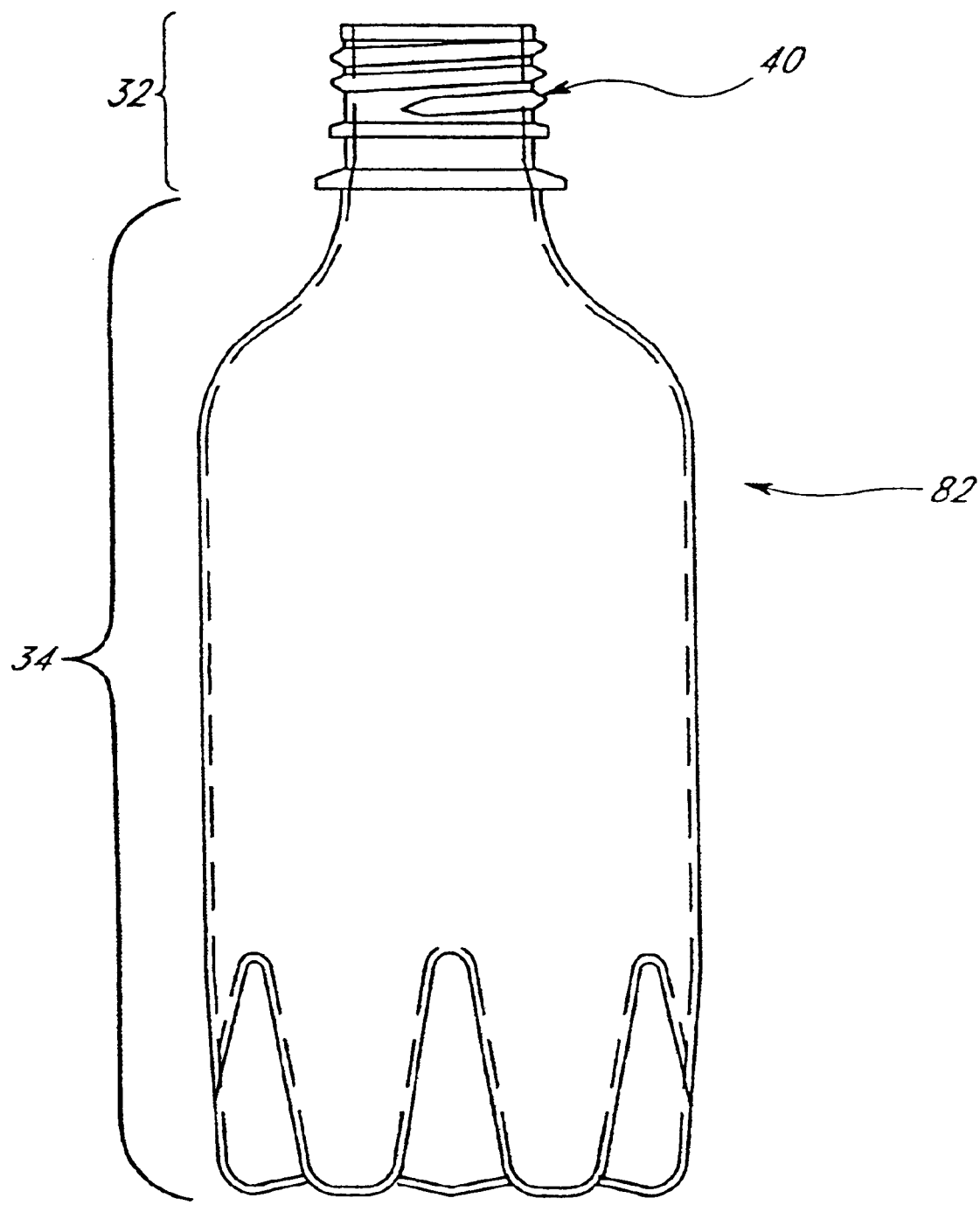
FIG. 7 is one preferred embodiment of multi-layer container.

Referring to FIG. 7, there is disclosed an embodiment of multi-layer container 82, such as that which might be made from blow molding the multi-layer preform 50 of FIG. 4. The container 82 has a neck portion 32 and a body portion 34 corresponding to the neck and body portions of the multi-layer preform 50 of FIG. 4. The neck portion 32 is further characterized by the presence of the threads 40 which provide a way to fasten a cap onto the container.

Figure 8:
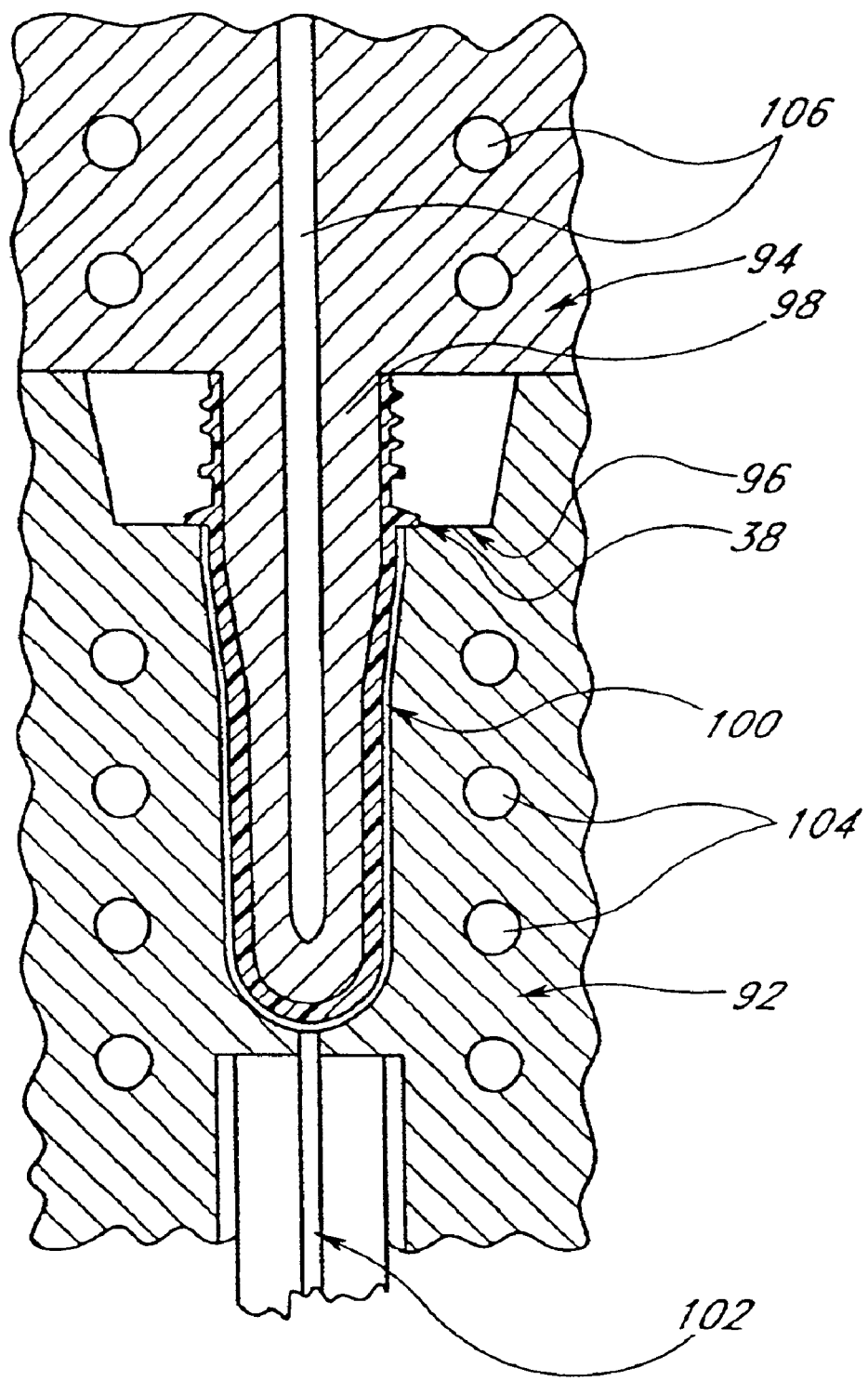
FIG. 8 is a cross-section of an injection mold of a type that may be used to make a preferred multi-layer preform.

FIG. 8 illustrates a preferred type of mold for use in methods that utilize overmolding. The mold comprises two halves, a cavity half 92 and a mandrel half 94. The cavity half 92 comprises a cavity in which a virgin-layer preform is placed. The preform is held in place between the mandrel half 94, which exerts pressure on the top of the preform and the ledge 96 of the cavity half 92 on which the support ring 38 rests. The neck portion 32 of the preform is thus sealed off from the body portion of the preform. Inside the preform is the mandrel 98. As the preform sits in the mold, the body portion of the preform is completely surrounded by a void space 100. The preform, thus positioned, acts as an interior die mandrel in the subsequent injection procedure, in which the melt of the overmolding material is injected through the gate 102 into the void space 100 to form the coating. The melt, as well as the virgin-layer preform, is cooled by fluid circulating within channels 104 and 106 in the two halves of the mold. Preferably the circulation in channels 104 is completely separate from the circulation in the channels 106.

Figure 9:
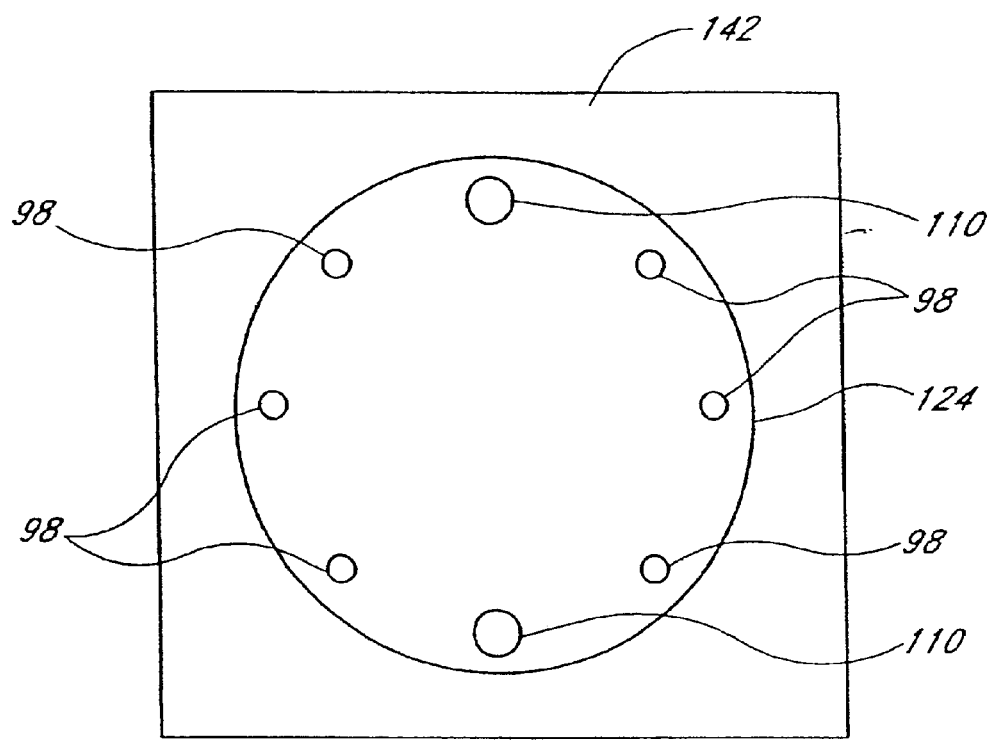
FIGS. 9 and 10 are two halves of a molding machine to make multi-layer preforms.
Figure 10:
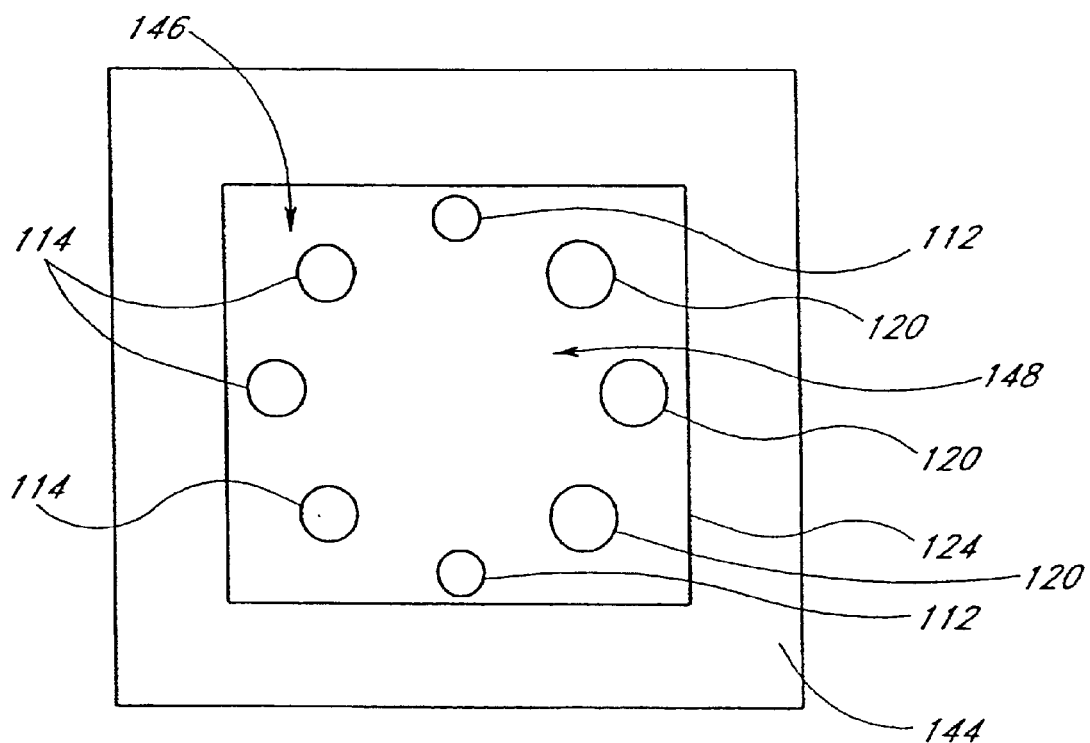

FIGS. 9 and 10 are a schematic of a portion of the preferred type of apparatus to make preferred multi-layer preforms. The apparatus is an injection molding system designed to make one or more virgin-layer preforms and subsequently coat the newly-made preforms by over-injection of a recycled material. FIGS. 9 and 10 illustrate the two halves of the mold portion of the apparatus which will be in opposition in the molding machine. The alignment pegs 110 in FIG. 9 fit into their corresponding receptacles 112 in the other half of the mold.

The mold half depicted in FIG. 10 has several pairs of mold cavities, each cavity being similar to the mold cavity depicted in FIG. 8. The mold cavities are of two types: first injection preform molding cavities 114 and second injection preform coating cavities 120. The two types of cavities are equal in number and are preferably arranged so that all cavities of one type are on the same side of the injection block 124 as bisected by the line between the alignment peg receptacles 112. This way, every preform molding cavity 114 is 180° away from a preform coating cavity 120.

The mold half depicted in FIG. 9 has several mandrels 98, one for each mold cavity (114 and 120). When the two halves which are FIGS. 9 and 10 are put together, a mandrel 98 fits inside each cavity and serves as the mold for the interior of the preform for the preform molding cavities 114 and as a centering device for the virgin-layer preforms in preform coating cavities 120. The mandrels 98 are mounted on a turntable 130 which rotates 180° about its center so that a mandrel 98 originally aligned with a preform molding cavity 114 will, after rotation, be aligned with a preform coating cavity 120, and vice-versa. As described in greater detail below, this type of setup allows a preform to be molded and then coated in a two-step process using the same piece of equipment.

It should be noted that the drawings in FIGS. 9 and 10 are merely illustrative. For instance, the drawings depict an apparatus having three molding cavities 114 and three coating cavities 120 (a 3/3 cavity machine). However, the machines may have any number of cavities, as long as there are equal numbers of molding and coating cavities, for example 12/12, 24/24, 36/36 and the like. A presently preferred arrangement utilizes 48 preform molding cavities and 48 preform coating cavities. The cavities may be arranged in any suitable manner, as can be determined by one skilled in the art. These and other minor alterations are contemplated as part of this invention.

Figure 11:
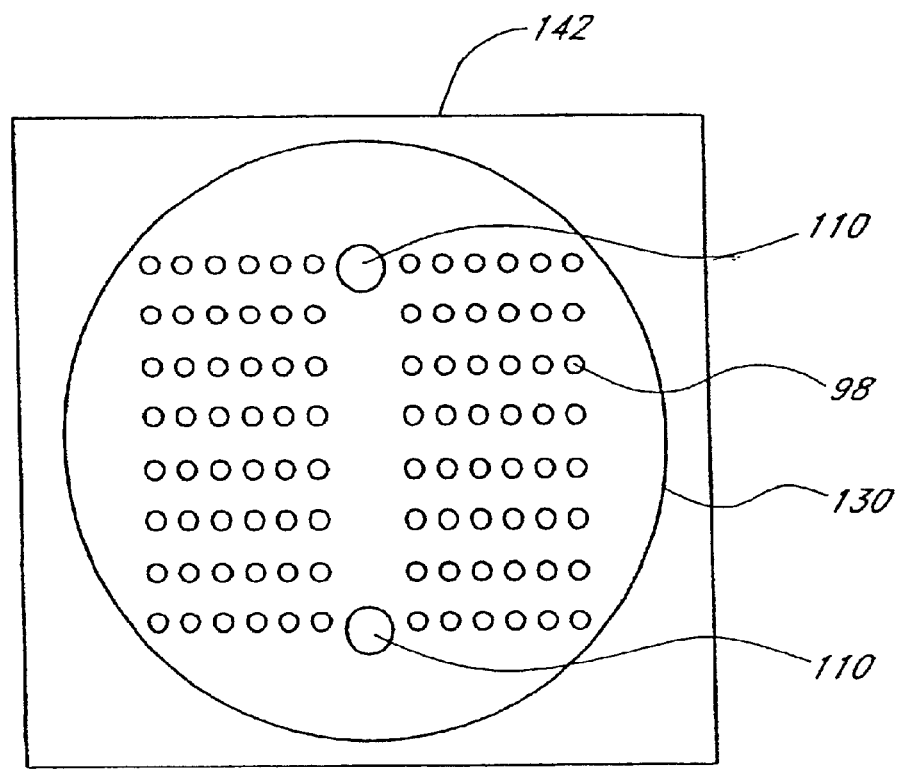
FIGS. 11 and 12 are two halves of a molding machine to make forty-eight two-layer preforms.
Figure 12:
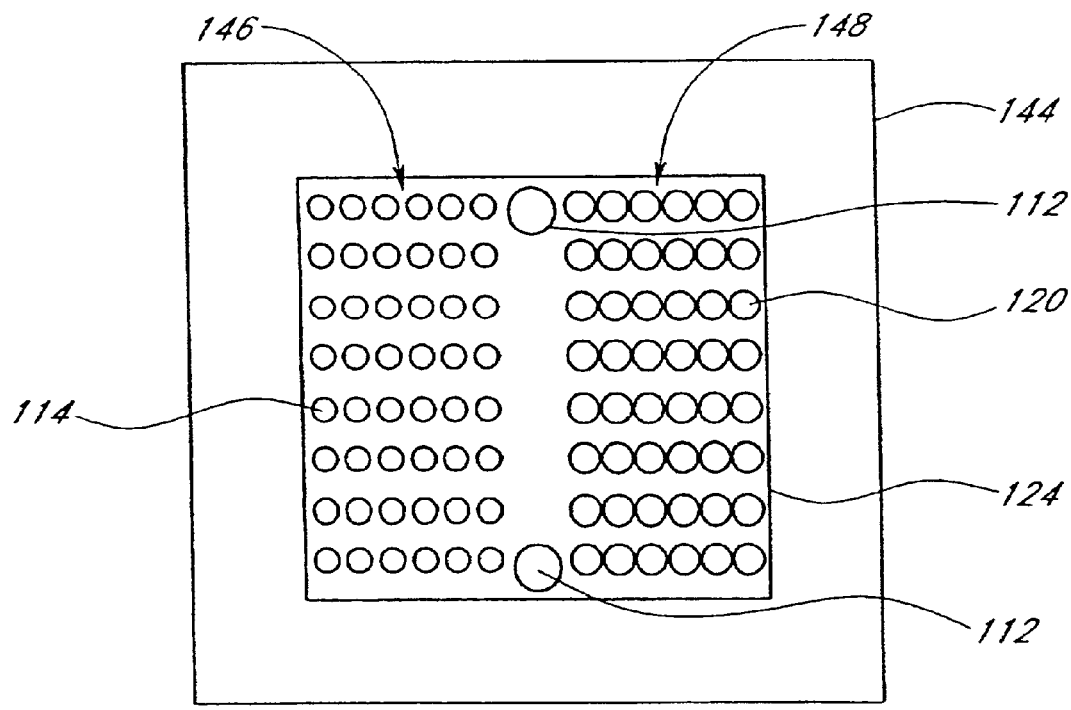
Figure 13:
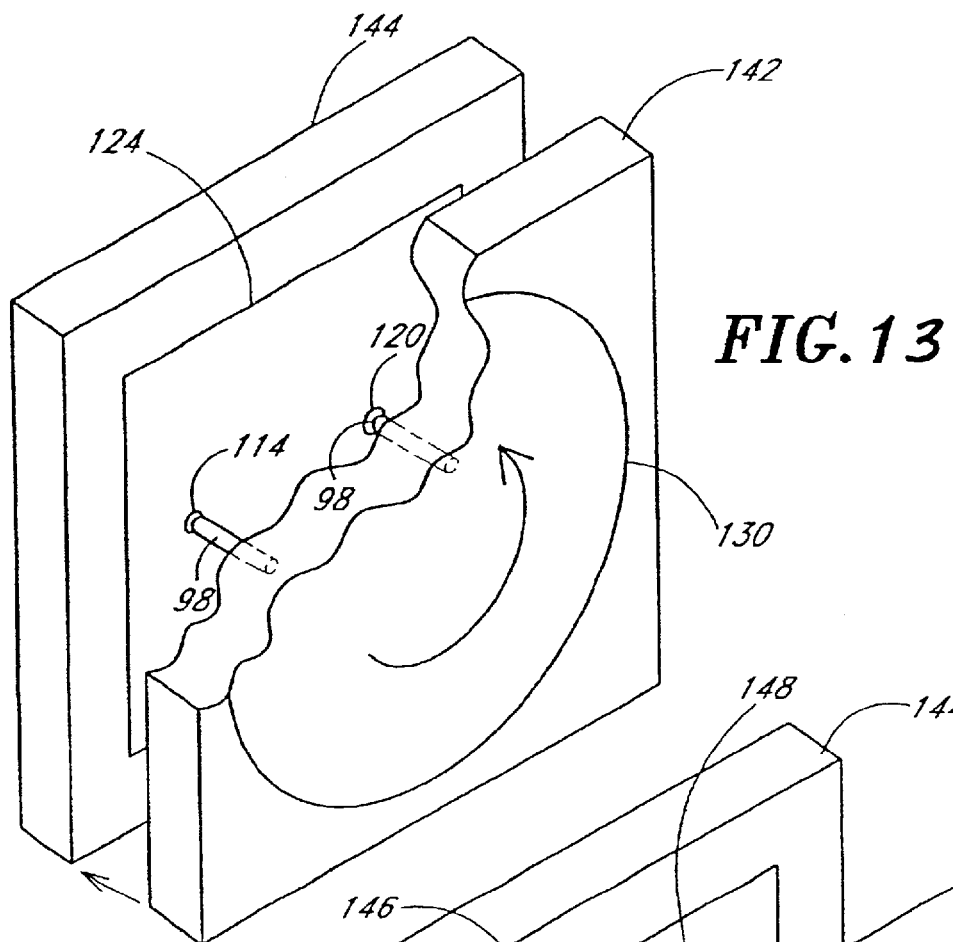
FIG. 13 is a perspective view of a schematic of a mold with mandrels partially located within the molding cavities.

The two mold halves depicted in FIGS. 11 and 12 illustrate an embodiment of a mold of a 48/48 cavity machine as discussed for FIGS. 9 and 10. Referring to FIG. 13 there is shown a perspective view of a mold of the type for an overmolding (inject-over-inject) process in which the mandrels 98 are partially located within the cavities 114 and 120. The arrow shows the movement of the movable mold half 142, on which the mandrels 98 lie, as the mold closes.

Figure 14:
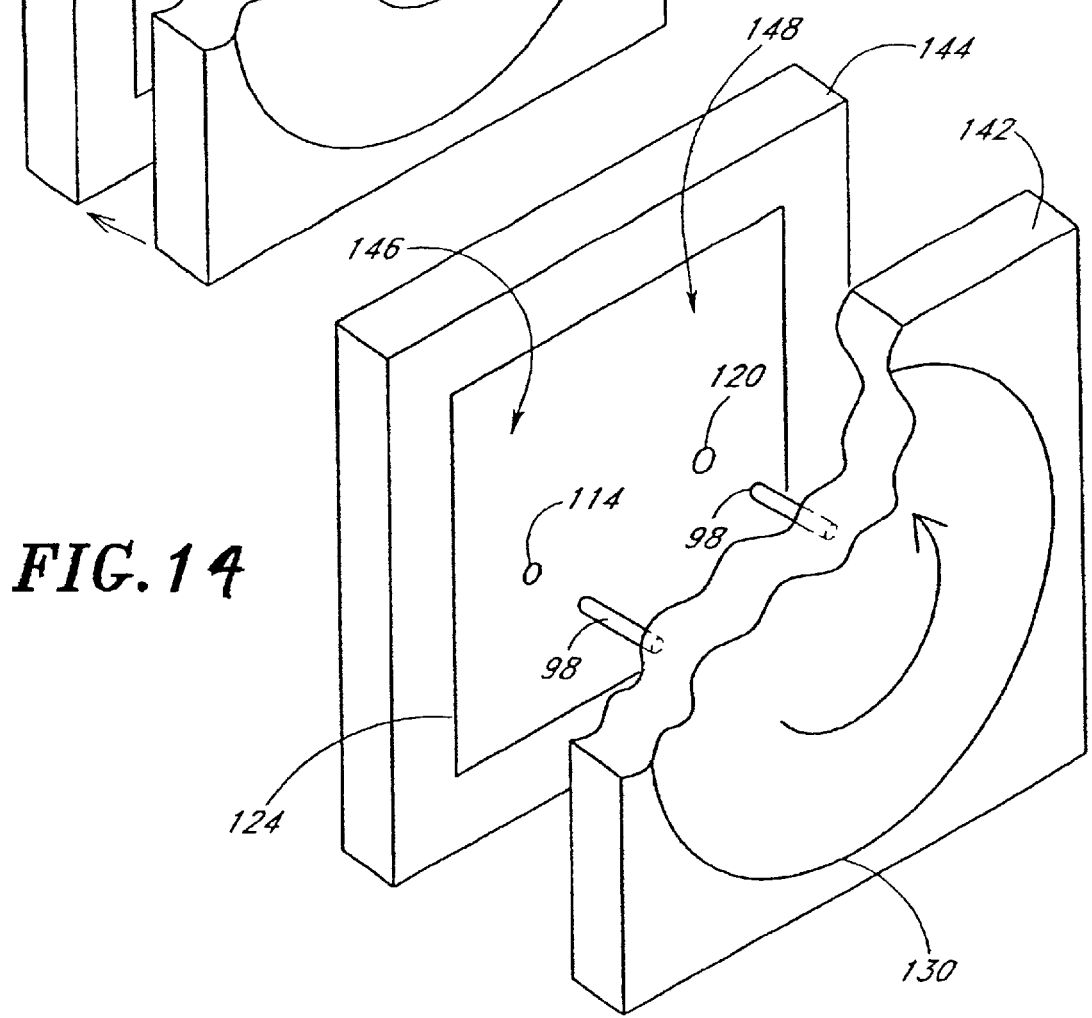
FIG. 14 is a perspective view of a mold with mandrels fully withdrawn from the molding cavities, prior to rotation.

FIG. 14 shows a perspective view of a mold of the type used in an overmolding process, wherein the mandrels 98 are fully withdrawn from the cavities 114 and 120. The arrow indicates that the turntable 130 rotates 180° to move the mandrels 98 from one cavity to the next. On the stationary half 144, the cooling for the preform molding cavity 114 is separate from the cooling for the preform coating cavity 120. Both of these are separate from the cooling for the mandrels 98 in the movable half.

Figure 15:
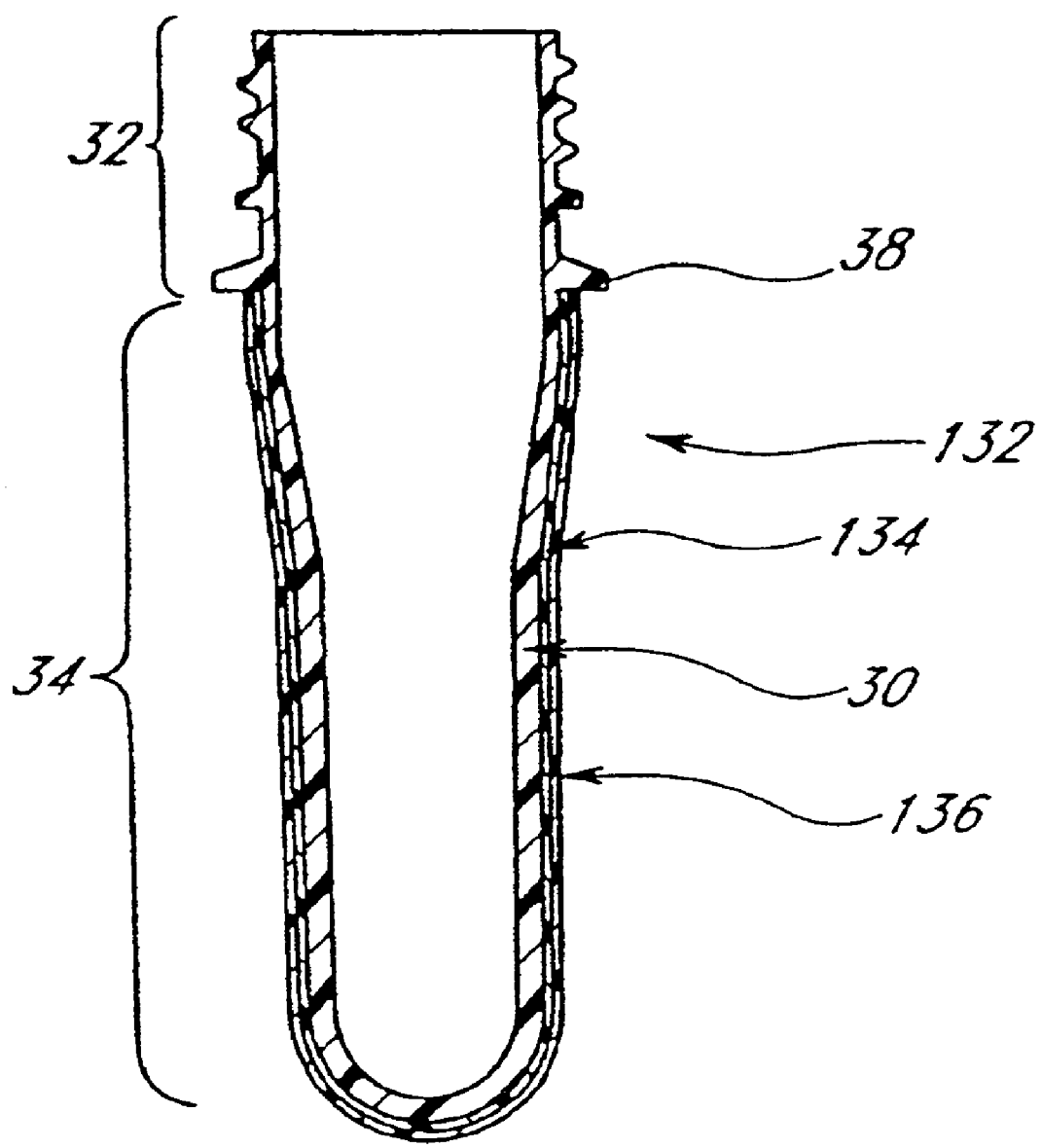
FIG. 15 is a three-layer embodiment of a preform.

Referring to FIG. 15 there is shown a preferred three-layer preform 132. This embodiment of multi-layer preform is preferably made by placing two coating layers 134 and 136 on a preform 30 such as that shown in FIG. 2. The third layer 136 is preferably a barrier layer made from a material with good gas-barrier properties. Alternatively, a barrier layer may be applied to the end container.

Figure 16:
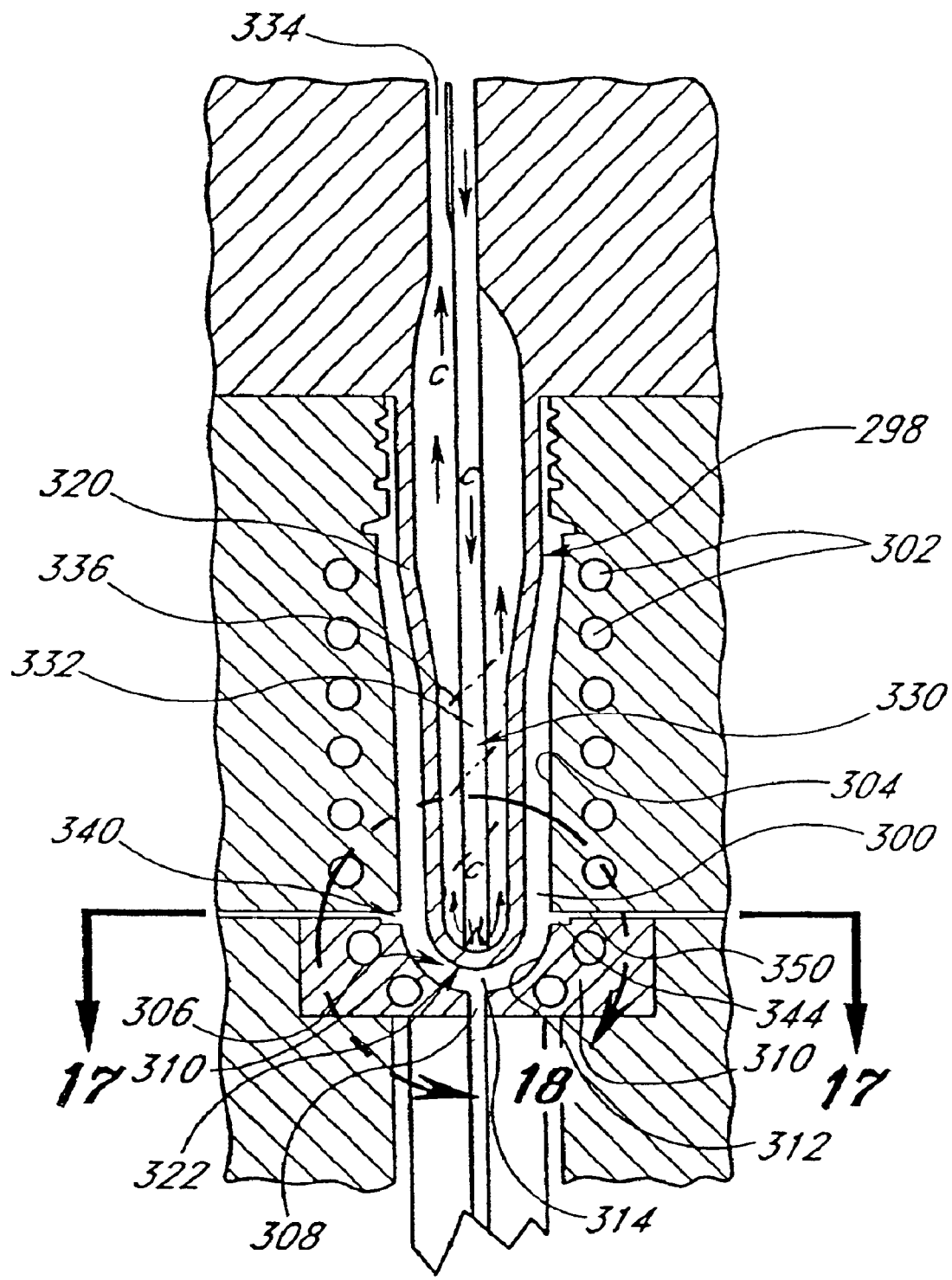
FIG. 16 is a cross-section of an injection mold of a type that may be used to make a preferred preform.

With next reference to FIG. 16, a preferred embodiment of a mold mandrel 298 and associated cavity 300 are shown. Cooling tubes 302 are formed in a spiral fashion just below the surface 304 of the mold cavity 300. A gate area 308 of the cavity 300 is defined near a gate 308 and an insert 310 of a material with especially high heat transfer properties is disposed in the cavity at the gate area 306. Thus, the injected preform's gate area/base end 314 is cooled especially quickly.

The mandrel 298 is hollow and has a wall 320 of generally uniform thickness. A bubbler cooling arrangement 330 is disposed within the hollow mandrel 298 and comprises a core tube 332 located centrally within the mandrel 298 which delivers chilled coolant C directly to a base end 322 of the mandrel 298. Coolant C works its way up the mandrel from the base end 322 and exits through an output line 334. The core tube is held in place by ribs 336 extending between the tube and the mandrel wall 320.

Figure 17:
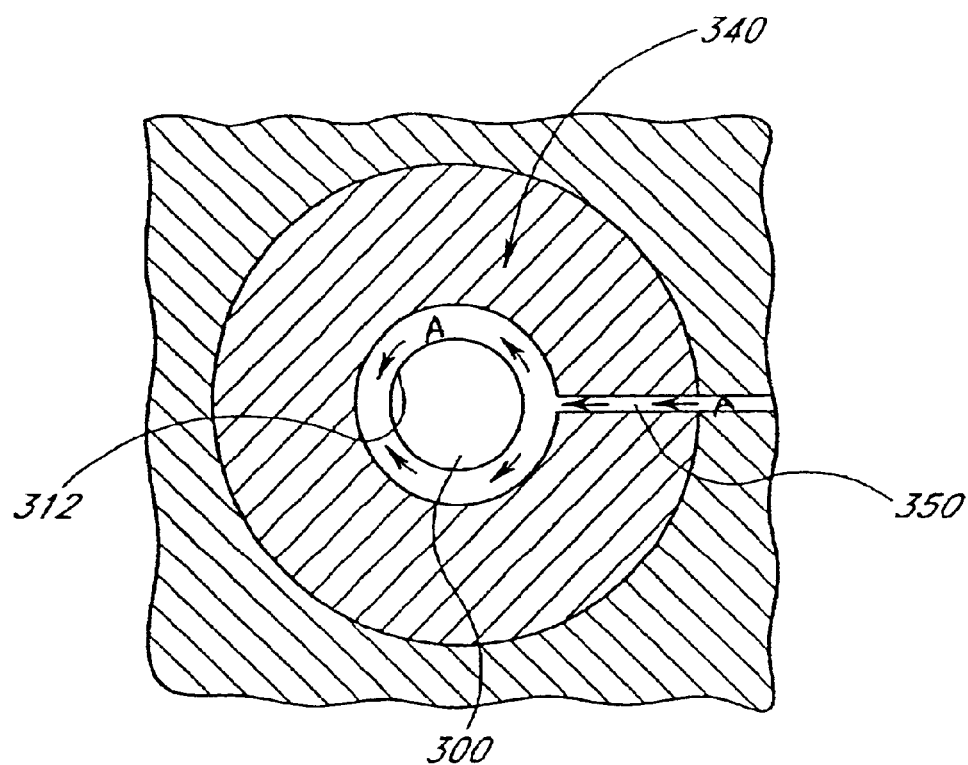
FIG. 17 is a cross-section of the mold of FIG. 16 taken along lines 17—17.
Figure 18:
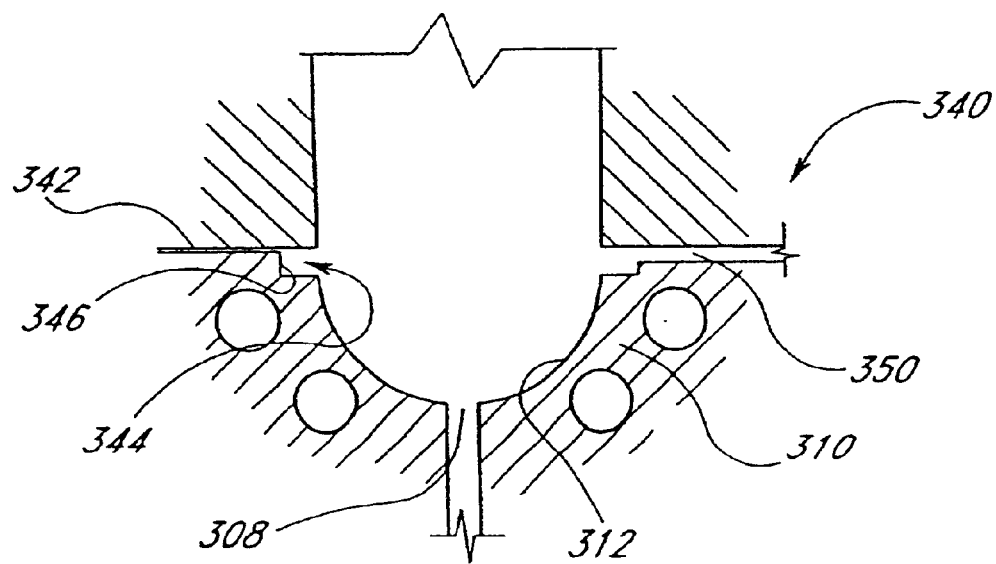
FIG. 18 is a cutaway close up view of the area of FIG. 16 defined by line 18.

Referring to FIGS. 17 and 18, an air insertion system 340 is shown formed at a joint 342 between members of the mold cavity 300. A notch 344 is formed circumferentially around the cavity 300. The notch 344 is sufficiently small that substantially no molten plastic will enter during melt injection. An air line 350 connects the notch 344 to a source of air pressure and a valve regulates the supply of air to the notch 344. During melt injection, the valve is closed. When injection is complete, the valve is opened and pressurized air A is supplied to the notch 344 in order to defeat a vacuum that may form between an injected preform and the cavity wall 304.

Figure 19:
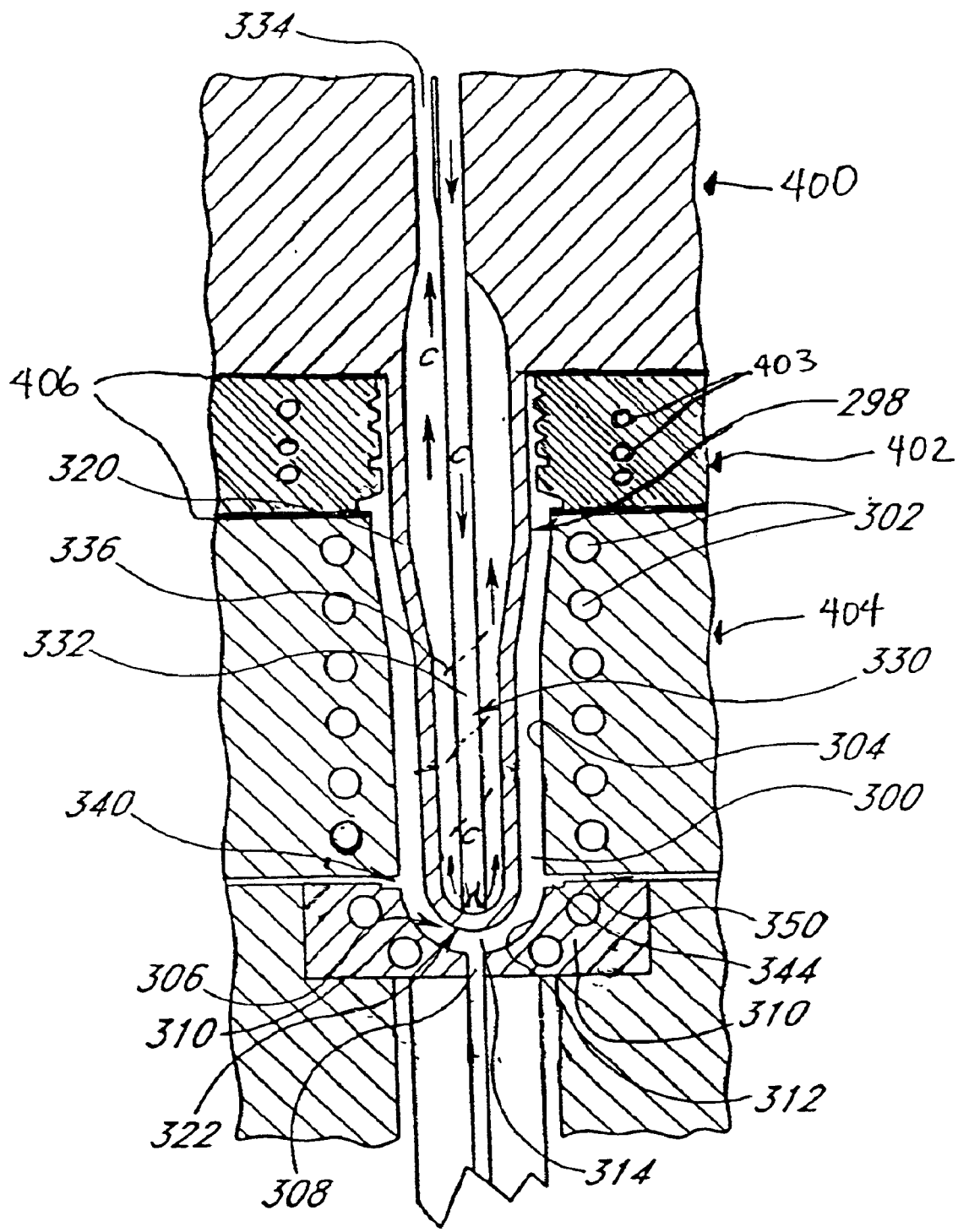
FIG. 19 is a cross-section of a preferred embodiment of a preform mold in which the core is shown within the mold cavity.

Referring to FIG. 19, a preferred embodiment of a mold for creating a warm-fill or hot-fill compatible bottle is shown. The mold apparatus shown in FIG. 19 is similar to that described in relation to FIG. 16 with the addition of a neck finish mold 402, preferably having the cooling tubes 403 separate from cooling tubes 302. This arrangement advantageously allows for independent control of the cooling for the body mold 404 and the neck finish mold 402 to achieve a crystallized neck finish and an amorphous body. Further details of the advantages of this arrangement will be described below.

PET, the preferred polyester, which is commonly made by condensation of terephthalic acid and ethylene glycol, may be purchased from Dow Chemical Company (Midland, Mich.), and Allied Signal Inc. (Baton Rouge, La.), among many others.

Preferably, the virgin PET used is that in which isophthalic acid (IPA) is added during the manufacture of the PET to form a copolymer. The amount of IPA added is preferably 2–10% by weight, more preferably 3–8% by weight, most preferably 4–5% by weight. The most preferred range is based upon current FDA regulations that currently do not allow for PET materials having an IPA content of more than 5% to be in contact with food or drink. High-IPA PET (PET having more than about 2% IPA by weight) can be made as discussed above, or purchased from a number of different manufacturers, for instance PET with 2% IPA may be purchased from SKF (Italy), PET with 4.8% IPA may be purchased from INCA (Dow Europe) and 10% IPA PET may be purchased from KoSa (Houston, Tex.).

Polyarylate alloys with PET may also be used, along with, or as an alternative to traditional PET materials. Preferred polyarylate/PET alloys may be purchased from Unitika America Corp. under the tradename U-POLYMER. The polyarylate/PET alloys display reduced volume shrinkage in comparison with ordinary PET as a result of a warm or hot-fill process. In addition, the polyarylate/PET alloys have increased U.V. barrier properties compared with ordinary PET material. Most other physical properties of the polyarylate/PET alloys are similar to those of ordinary PET.

As discussed above, if it is desired barrier materials may be added to the RPET or PCR PET to provide, or otherwise enhance the barrier properties of the preform. Examples of preferred polyamide barrier materials include MXD-6 from Mitsubishi Gas Chemical (Japan). Other preferred barrier materials are "Polyamide Blends" which are blends of polyamide and polyester containing preferably about 140% of polyester in polyamide, about 1–40% polyamide in polyester, or about 1–40% of the about 1–40% polyamide in polyester blend in polyamide. These blends more preferably include about 5–30% of the lesser component. The blends may incorporate a compatibilizer such as dianhydrides of tetracarboxylic acids, or other such compatibilizers such as are disclosed in European Patent Application No. 964,031. One preferred dianhydride is pyromellitic dianhydride (PMDA). It may be used to form blends or it may be incorporated into a single polymer to increase its ability to adhere to other layers of materials. The polyester used in Polyamide Blends is preferably PET, more preferably high IPA PET. These materials are preferably made by adding the component present in smaller quantity to the polycondensation mixture of the polymer present in larger quantity. "Polyamide Blends" as used herein shall include all of the aforementioned types of blends, whether such blends were made by reacting or compounding of the materials.

An especially preferred method of producing a recycled-content, multi-layer PET preform is referred to herein generally as overmolding, and sometimes as inject-over-inject ("IOI"). The name refers to a procedure which uses injection molding to inject one or more layers of a recycled material over an existing preform, which preferably was itself made by injection molding. The terms "overinjecting" and "overmolding" are used herein to describe the coating process whereby a layer of material, preferably comprising recycled material, is injected over an existing preform. In an especially preferred embodiment, the overinjecting process is performed while the underlying preform has not yet fully cooled.

The overmolding is carried out by using an injection molding process using equipment similar to that used to form the virgin-layer preform itself. A preferred mold for overmolding, with a virgin-layer preform in place is shown in FIG. 8. The mold comprises two halves, a cavity half 92 and a mandrel half 94, and is shown in FIG. 8 in the closed position prior to overinjecting. The cavity half 92 comprises a cavity in which the virgin-layer preform is placed. The support ring 38 of the preform rests on a ledge 96 and is held in place by the mandrel half 94, which exerts pressure on the support ring 38, thus sealing the neck portion off from the body portion of the preform. The cavity half 92 has a plurality of tubes or channels 104 therein which carry a fluid. Preferably the fluid in the channels circulates in a path in which the fluid passes into an input in the cavity half 92, through the channels 104, out of the cavity half 92 through an output, through a chiller or other cooling device, and then back into the input. The circulating fluid serves to cool the mold, which in turn cools the plastic melt which is injected into the mold to form the multi-layer preform.

The mandrel half 94 of the mold comprises a mandrel 98. The mandrel 98, sometimes called a core, protrudes from the mandrel half 94 of the mold and occupies the central cavity of the preform. In addition to helping to center the preform in the mold, the mandrel 98 cools the interior of the preform. The cooling is done by fluid circulating through channels 106 in the mandrel half 94 of the mold, most importantly through the length of the mandrel 98 itself. The channels 106 of the mandrel half 94 work in a manner similar to the channels 104 in the cavity half 92, in that they create the portion of the path through which the cooling fluid travels which lies in the interior of the mold half. As the preform sits in the mold cavity, the body portion of the preform is centered within the cavity and is completely surrounded by a void space 100. The preform, thus positioned, acts as an interior die mandrel in the subsequent injection procedure. The melt of the overmolding material, preferably comprising a recycled material, is then introduced into the mold cavity from the injector via gate 102 and flows around the preform, preferably surrounding at least the body portion 34 of the preform. Following overinjection, the overmolded layer will take the approximate size and shape of the void space 100.

To carry out the overmolding procedure, one preferably heats the initial preform which is to be coated preferably to a temperature above its Tg. In the case of PET, that temperature is preferably 100 to 300° C., more preferably 180–225° C. If a temperature at or above the temperature of crystallization for PET is used, which is about 120° C., care should be taken when cooling the PET in the preform. The cooling should be sufficient to minimize crystallization of the PET in the preform so that the PET is in the preferred semi-crystalline state. Alternatively, the initial preform used may be one which has been very recently injection molded and not fully cooled, as to be at an elevated temperature as is preferred for the overmolding process.

The recycled, coating material is heated to form a melt of a viscosity compatible with use in an injection molding apparatus. If recycled PET is used, the inject temperature is preferably 250–320° C. The coating material is then injected into the mold in a volume sufficient to fill the void space 100.

The multi-layer preform is preferably cooled at least to the point where it can be displaced from the mold or handled without being damaged, and removed from the mold where further cooling may take place. If PET is used, and the preform has been heated to a temperature near or above the temperature of crystallization for PET, the cooling should be fairly rapid and sufficient to ensure that the PET is primarily in the semi-crystalline state when the preform is fully cooled. As a result of this process, a strong and effective bonding takes place between the initial preform and the subsequently applied recycled material.

Overmolding can be also used to create multi-layer preforms with three or more layers. In FIG. 15, there is shown a three-layer embodiment of a preform 132. The preform shown therein has two coating layers, a middle layer 134 and an outer layer 134. The relative thickness of the layers shown in FIG. 15 may be varied to suit a particular combination of layer materials or to allow for the making of different sized bottles. As will be understood by one skilled in the art, a procedure analogous to that disclosed above would be followed, except that the initial preform would be one which had already been coated, as by one of the methods for making multi-layer preforms described herein, including overmolding.

A Preferred Method and Apparatus for Overmolding

A preferred apparatus for performing the overmolding process is based upon the use of a 330-330-200 machine by Engel (Austria). The preferred mold portion the machine is shown schematically in FIGS. 10–15 and comprises a movable half 142 and a stationary half 144. Both halves are preferably made from hard metal. The stationary half 144 comprises at least two mold sections 146, 148, wherein each mold section comprises N (N>0) identical mold cavities 114, 120, an input and output for cooling fluid, channels allowing for circulation of cooling fluid within the mold section, injection apparatus, and hot runners channeling the molten material from the injection apparatus to the gate of each mold cavity. Because each mold section forms a distinct preform layer, and each preform layer is preferably made of a different material, each mold section is separately controlled to accommodate the potentially different conditions required for each material and layer. The injector associated with a particular mold section injects a molten material, at a temperature suitable for that particular material, through that mold section's hot runners and gates and into the mold cavities. The mold section's own input and output for cooling fluid allow for changing the temperature of the mold section to accommodate the characteristics of the particular material injected into a mold section. Consequently, each mold section may have a different injection temperature, mold temperature, pressure, injection volume, cooling fluid temperature, etc. to accommodate the material and operational requirements of a particular preform layer.

The movable half 142 of the mold comprises a turntable 130 and a plurality of cores or mandrels 98. The alignment pins guide the movable half 142 to slidably move in a preferably horizontal direction towards or away from the stationary half 144. The turntable 130 may rotate in either a clockwise or counterclockwise direction, and is mounted onto the movable half 142. The plurality of mandrels 98 are affixed onto the turntable 130. These mandrels 98 serve as the mold form for the interior of the preform, as well as serving as a carrier and cooling device for the preform during the molding operation. The cooling system in the mandrels is separate from the cooling system in the mold sections.

The mold temperature or cooling for the mold is controlled by circulating fluid. There is separate cooling fluid circulation for the movable half 142 and for each of the mold sections 146, 148 of the stationary half 144. Therefore, in a mold having two mold sections in the stationary half 144, there is separate cooling for each of the two mold sections plus separate cooling for the movable half 142 of the mold. Analogously, in a mold having three mold sections in the stationary half, there are four separate cooling fluid circulation set ups: one for each mold section, for a total of three, plus one for the movable half 142. Each cooling fluid circulation set up works in a similar manner. The fluid enters the mold, flows through a network of channels or tubes inside as discussed above for FIG. 8, and then exits through an output. From the output, the fluid travels through a pump, which keeps the fluid flowing, and a chilling system to keep the fluid within the desired temperature range, before going back into the mold.

In a preferred embodiment, the mandrels and cavities are constructed of a high heat transfer material, such a beryllium, which is coated with a hard metal, such as tin or chrome. The hard coating keeps the beryllium from direct contact with the preform, as well as acting as a release for ejection and providing a hard surface for long life. The high heat transfer material allows for more efficient cooling, and thus assists in achieving lower cycle times and also helps improve interlayer adhesion. The high heat transfer material may be disposed over the entire area of each mandrel and/or cavity, or it may be only on portions thereof. Preferably at least the tips of the mandrels comprise high heat transfer material. Another, even more preferred high heat transfer material is ampcoloy, which is commercially available from Uudenholm, Inc.

The number of mandrels is equal to the total number of cavities, and the arrangement of the mandrels 98 on the movable half 142 mirrors the arrangement of the cavities 114, 120 on the stationary half 144. To close the mold, the movable half 142 moves towards the stationary half 144, mating the mandrels 98 with the cavities 114, 120. To open the mold, the movable half 142 moves away from the stationary half 144 such that the mandrels 98 are well clear of the block on the stationary half 144. After the mandrels are fully withdrawn 98 from the mold sections 146, 148, the turntable 130 of the movable half 142 rotates the mandrels 98 into alignment with a different mold section. Thus, the movable half rotates 360°/(number of mold sections in the stationary half) degrees after each withdrawal of the mandrels from the stationary half. When the machine is in operation, during the withdrawal and rotation steps, there will be preforms present on some or all of the mandrels.

The size of the cavities in a given mold section 146, 148 will be identical; however the size of the cavities will differ among the mold sections. The cavities in which the virgin-layer preforms are first molded, the preform molding cavities 114, are smallest in size. The size of the cavities 120 in the mold section 148 in which the first coating step is performed are larger than the preform molding cavities 114, in order to accommodate the virgin-layer preform and still provide space for the coating material, preferably recycled material, to be injected to form the overmolded coating. The cavities in each subsequent mold section wherein additional overmolding steps are performed will be increasingly larger in size to accommodate the preform as it gets larger with each coating step.

After a set of preforms has been molded and overmolded to completion, a series of ejectors eject the finished preforms off of the mandrels 98. The ejectors for the mandrels operate independently, or at least there is a single ejector for a set of mandrels equal in number and configuration to a single mold section, so that only the completed preforms are ejected. Uncoated preforms remain on the mandrels so that they may continue in the cycle to the next mold section. The ejection may cause the preforms to completely separate from the mandrels and fall into a bin or onto a conveyor. Alternatively, the preforms may remain on the mandrels after ejection, after which a robotic arm or other such apparatus grasps a preform or group of preforms for removal to a bin, conveyor, or other desired location.

FIGS. 9 and 10 illustrate a schematic for an embodiment of the apparatus described above. FIG. 10 is the stationary half 144 of the mold. In this embodiment, the block 124 has two mold sections, one section 146 comprising a set of three preform molding cavities 114 and the other section 148 comprising a set of three preform coating cavities 120. Each of the preform coating cavities 120 is preferably like that shown in FIG. 8, discussed above. Each of the preform molding cavities 114 is preferably similar to that shown in FIG. 8, in that the material is injected into a space defined by the mandrel 98 (albeit without a preform already thereon) and the wall of the mold which is cooled by fluid circulating through channels inside the mold block. Consequently, one full production cycle of this apparatus will yield three two-layer preforms. If more than three preforms per cycle is desired, the stationary half can be reconfigured to accommodate more cavities in each of the mold sections. An example of this is seen in FIG. 12, wherein there is shown a stationary half of a mold comprising two mold sections, one 146 comprising forty-eight preform molding cavities 114 and the other 148 comprising forty-eight preform coating cavities 120. If a three or more layer preform is desired, the stationary half 144 can be reconfigured to accommodate additional mold sections, one for each preform layer FIG. 9 illustrates the movable half 142 of the mold. The movable half comprises six identical mandrels 98 mounted on the turntable 130. Each mandrel 98 corresponds to a cavity on the stationary half 144 of the mold. The movable half also comprises alignment pegs 110, which correspond to the receptacles 112 on the stationary half 144. When the movable half 142 of the mold moves to close the mold, the alignment pegs 110 are mated with their corresponding receptacles 112 such that the molding cavities 114 and the coating cavities 120 align with the mandrels 98. After alignment and closure, half of the mandrels 98 are centered within preform molding cavities 114 and the other half of the mandrels 98 are centered within preform coating cavities 120.

The configuration of the cavities, mandrels, and alignment pegs and receptacles must all have sufficient symmetry such that after the mold is separated and rotated the proper number of degrees, all of the mandrels line up with cavities and all alignment pegs line up with receptacles. Moreover, each mandrel must be in a cavity in a different mold section than it was in prior to rotation in order to achieve the orderly process of molding and overmolding in an identical fashion for each preform made in the machine.

Two views of the two mold halves together are shown in FIGS. 13 and 14. In FIG. 13, the movable half 142 is moving towards the stationary half 144, as indicated by the arrow. Two mandrels 98, mounted on the turntable 130, are beginning to enter cavities, one enters a molding cavity 114 and the other is entering a coating cavity 120 mounted in the block 124. In FIG. 14, the mandrels 98 are fully withdrawn from the cavities on the stationary side. The preform molding cavity 114 has cooling circulation which is separate from the cooling circulation for the preform coating cavity 120, which comprises the other mold section 148. The two mandrels 98 are cooled by a single system that links all the mandrels together. The arrow in FIG. 14 shows the rotation of the turntable 130. The turntable 130 could also rotate clockwise. Not shown are coated and virgin-layer preforms which would be on the mandrels if the machine were in operation. The alignment pegs and receptacles have also been left out for the sake of clarity.

The operation of the overmolding apparatus will be discussed in terms of the preferred two mold section apparatus for making a two-layer preform. The mold is closed by moving the movable half 142 towards the stationary half 144 until they are in contact. A first injection apparatus injects a melt of first material into the first mold section 146, through the hot runners and into the preform molding cavities 114 via their respective gates to form the virgin-layer preforms each of which become the inner layer of a multi-layer preform. The first material fills the void between the preform molding cavities 114 and the mandrels 98. Simultaneously, a second injection apparatus injects a melt of second material into the second mold section 148 of the stationary half 144, through the hot runners and into each preform coating cavity 120 via their respective gates, such that the second material fills the void (100 in FIG. 8) between the wall of the coating cavity 120 and the virgin-layer preform mounted on the mandrel 98 therein.

During this entire process, cooling fluid is circulating through the three separate areas, corresponding to the mold section 146 of the preform molding cavities 114, mold section 148 of the preform coating cavities 120, and the movable half 142 of the mold, respectively. Thus, the melts and preforms are being cooled in the center by the circulation in the movable half that goes through the interior of the mandrels, as well as on the outside by the circulation in each of the cavities. The operating parameters of the cooling fluid in the first mold section 146 containing preform molding cavities 114 are separately controlled from the operating parameters of the cooling fluid in the second mold section 148 containing the coating cavities to account for the different material characteristics of the preform and the coating. These are in turn separate from those of the movable half of 142 the mold that provides constant cooling for the interior of the preform throughout the cycle, whether the mold is open or closed.

The movable half 142 then slides back to separate the two mold halves and open the mold until all of the mandrels 98 having preforms thereon are completely withdrawn from the preform molding cavities 114 and preform coating cavities 120. The ejectors eject the coated, finished preforms off of the mandrels 98 that were just removed from the preform coating cavities. As discussed above, the ejection may cause the preforms to completely separate from the mandrels and fall into a bin or onto a conveyor, or if the preforms remain on the mandrels after ejection, a robotic arm or other apparatus may grasp a preform or group of preforms for removal to a bin, conveyor, or other desired location. The turntable 130 then rotates 180° so that each mandrel 98 having a virgin-layer preform thereon is positioned over a preform coating cavity 120, and each mandrel from which a multi-layer preform was just ejected is positioned over a preform molding cavity 114. Rotation of the turntable 130 may occur as quickly as 0.5–0.9 seconds. Using the alignment pegs 110, the mold halves again align and close, and the first injector injects the first material into the preform molding cavity 114 while the second injector injects the recycled material into the preform coating cavity 120.

A production cycle of closing the mold, injecting the melts, opening the mold, ejecting finished multi-layer preforms, rotating the turntable, and closing the mold is repeated, so that preforms are continuously being molded and overmolded.

When the apparatus first begins running, during the initial cycle, no preforms are yet in the preform coating cavities 120. Therefore, the operator should either prevent the second injector from injecting the second material into the second mold section during the first injection, or allow the second material to be injected and eject and then discard the resulting single layer preform comprised solely of the second material. After this start-up step, the operator may either manually control the operations or program the desired parameters such that the process is automatically controlled.

Two layer preforms may be made using the first preferred overmolding apparatus described above. In one preferred embodiment, the two-layer preform comprises an inner layer comprising virgin polyester and an outer layer comprising recycled polyester. In especially preferred embodiments, the inner layer comprises virgin PET and the outer layer comprises recycled PET. The description hereunder is directed toward the especially preferred embodiments of two layer preforms comprising an inner layer of virgin PET and an outer layer of recycled PET. The description is directed toward describing the formation of a single set of multi-layer preforms 60 of the type seen in FIG. 5, that is, following a set of preforms through the process of molding, overmolding and ejection, rather than describing the operation of the apparatus as a whole. The process described is directed toward preforms having a total thickness in the wall portion 66 of about 3 mm, comprising about 2 mm of virgin PET and about 1 mm of recycled PET. The thickness of the two layers will vary in other portions of the preform 60, as shown in FIG. 5.

It will be apparent to one skilled in the art that some of the parameters detailed below will differ if other embodiments of preforms are used. For example, the amount of time which the mold stays closed will vary depending upon the wall thickness of the preforms. However, given the disclosure below for this preferred embodiment and the remainder of the disclosure herein, one skilled in the art would be able to determine appropriate parameters for other preform embodiments.

The apparatus described above is set up so that the injector supplying the mold section 146 containing the preform molding cavities 114 is fed with virgin PET and that the injector supplying the mold section 148 containing the preform coating cavities 120 is fed with recycled PET. Both mold halves are cooled by circulating fluid, preferably water, at a temperature of preferably 0–30° C., more preferably 10–15° C.

The movable half 142 of the mold is moved so that the mold is closed. A melt of virgin PET is injected through the back of the block 124 and into each preform molding cavity 114 to form a virgin-layer preform 30 which becomes the inner layer of the multi-layer preform. The injection temperature of the virgin PET melt is preferably 250 to 320° C., more preferably 255 to 280° C. The mold is kept closed for preferably 3 to 10 seconds, more preferably 4 to 6 seconds while the virgin PET melt stream is injected and then cooled by the coolant circulating in the mold. During this time, surfaces of the preforms which are in contact with surfaces of preform molding cavities 114 or mandrels 98 begin to form a skin while the cores of the preforms remain molten and unsolidified.

The movable half 142 of the mold is then moved so that the two halves of the mold are separated at or past the point where the newly molded preforms, which remain on the mandrels 98, are clear of the stationary side 144 of the mold. The interior of the preforms, in contact with the mandrel 98, continues to cool. The cooling is preferably done in a manner which rapidly removes heat so that crystallization of the virgin PET is minimized so that the virgin PET will be in a semi-crystalline state. The chilled water circulating through the mold, as described above, should be sufficient to accomplish this task.

While the inside of the preform is cooling, the temperature of the exterior surface of the preform begins to rise as it absorbs heat from the molten core of the preform. This heating elevates the surface temperature of the exterior surface of the newly molded preform. The exterior surface, although having been cooled while in the mold cavity 114, increases in temperature when removed from the cavity as the result of significant heat absorption from the molten core. Thus, the initial formation and later softening of a skin on the exterior surface speeds the overall cooling of the molten preform and helps avoid excessive crystallization.

When the mandrels 98 are clear of the stationary side 144 of the mold, the turntable 130 then rotates 180° so that each mandrel 98 having a molded preform thereon is positioned over a preform coating cavity 120. Thus positioned, each of the other mandrels 98 which do not have molded preforms thereon, are each positioned over a preform molding cavity 114. The mold is again closed. Preferably the time between removal from the preform molding cavity 114 to insertion into the preform coating cavity 120 is 1 to 10 seconds, and more preferably 1 to 3 seconds.

When the molded preforms are first placed into preform coating cavities 120, the exterior surfaces of the preforms are not in contact with a mold surface. Thus, the exterior skin is still hot as described above because the contact cooling is only from the mandrel inside. The high temperature of the exterior surface of the virgin-layer preform (which forms the inner layer of the multi-layer preform) aids in promoting adhesion between the virgin PET and recycled PET in the finished multi-layer preform. It is postulated that the surfaces of the materials are more reactive when hot, and thus chemical interactions between the recycled PET and the virgin PET will be enhanced by the high temperatures. Recycled PET will adhere to a preform with a cold surface, and thus the operation may be performed using a cold initial virgin-layer preform, but the adhesion is markedly better when the overmolding process is done at an elevated temperature, as occurs immediately following the molding of the virgin-layer preform.

A second injection operation then follows in which a melt of a recycled material, is injected into each preform coating cavity 120 to coat the preforms. The temperature of the melt of recycled material is preferably 250 to 320° C., more preferably 255 to 280° C. During the same time that this set of preforms are being overmolded with recycled material in the preform coating cavities 120, another set of virgin-layer preforms is being molded in the preform molding cavities 114 as described above.

The two halves of the mold are again separated preferably 3 to 10 seconds, more preferably 4 to 6 seconds following the initiation step. The preforms which have just been coated with recycled material in the preform coating cavities 120, are ejected from the mandrels 98. The virgin-layer preforms that were just molded in preform molding cavities 114 remain on their mandrels 98. The turntable 130 is then rotated 180° so that each mandrel having a virgin-layer preform thereon is positioned over a coating cavity 120 and each mandrel 98 from which a multi-layer preform was just removed is positioned over a molding cavity 114.

The cycle of closing the mold, injecting the materials, opening the mold, ejecting finished multi-layer preforms, rotating the turntable, and closing the mold is repeated, so that preforms are continuously being molded and overmolded. Those of skill in the art will appreciate that dry cycle time of the apparatus may increase the overall production cycle time for molding a complete preform.

One of the many advantages of using the process disclosed herein is that the cycle times for the process are similar to those for the standard process to produce single-layer preforms; that is the molding and coating of preforms by this process is done in a period of time similar to that required to make uncoated PET preforms of similar size by standard methods currently used in preform production. Therefore, one can make recycled-content, multi-layer PET preforms instead of virgin, single-layer PET preforms without a significant change in production output and capacity.

If a PET melt cools slowly, the PET will take on a crystalline form. Because crystalline polymers do not blow mold as well as amorphous polymers, a preform of crystalline PET would not be expected to perform as well in forming containers under the conditions described herein. If, however, the PET is cooled at a rate faster than the crystal formation rate, as is described herein, crystallization will be minimized and the PET will take on a semi-crystalline form. The amorphous or semi-crystalline form is ideal for blow molding. Thus, sufficient cooling of the PET is crucial to forming preforms which will perform as needed when processed.

The rate at which a layer of PET cools in a mold such as described herein is proportional to the thickness of the layer of PET, as well as the temperature of the cooling surfaces with which it is in contact. If the mold temperature factor is held constant, a thick layer of PET cools more slowly than a thin layer. This is because it takes a longer period of time for heat to transfer from the inner portion of a thick PET layer to the outer surface of the PET which is in contact with the cooling surfaces of the mold than it would for a thinner layer of PET because of the greater distance the heat must travel in the thicker layer. In other words, a thicker layer of PET has an increased insulating effect compared to a thin layer of PET, tending to hold heat internally for a longer amount of time. Accordingly, a preform having a thicker layer of PET needs to be in contact with the cooling surfaces of the mold for a longer time than does a preform having a thinner layer of PET. With all things being equal, it takes longer to mold a preform having a thick wall of PET than it takes to mold a preform having a thin wall of PET.

The virgin-layer preforms, including those made by the first injection in the above-described apparatus, are preferably thinner than a conventional PET preform for a given container size. This is because in making the multi-layer preforms, a quantity of the virgin PET which would be in a conventional PET preform can be displaced by a similar quantity of recycled PET. Because the preferred virgin-layer preforms which form the inner layer of the multi-layer preforms are thin-walled, they can be removed from the mold sooner than their thicker-walled conventional counterparts. For example, the virgin-layer preform can be removed from the mold preferably after about 4–6 seconds without crystallizing, as compared to about 12–24 seconds for a conventional PET preform having a total wall thickness of about 3 mm. All in all, the time to make a recycled-content multi-layer preform is equal to or slightly greater (up to about 30%) than the time required to make a monolayer PET preform of this same total thickness.

The advantage gained by a thinner preform can be taken a step farther if a preform made in the process is of the type in FIG. 5. In this embodiment of a multi-layer preform, the virgin PET preform wall thickness at 70 in the center of the area of the end cap 42 is reduced to preferably about ⅓ of the total wall thickness. Moving from the center of the end cap out to the end of the radius of the end cap, the thickness gradually increases to preferably about ⅔ of the total wall thickness, as at reference number 68 in the wall portion 66. The wall thickness may remain constant or it may, as depicted in FIG. 5, transition to a lower thickness prior to the support ring 38. The thickness of the various portions of the preform may be varied, but in all cases, the virgin PET and recycled PET wall thicknesses must remain above critical melt flow thickness for any given preform design.

Using preforms 60 of the design in FIG. 5 allows for even faster cycle times than that used to produce preforms 50 of the type in FIG. 4. As mentioned above, one of the biggest barriers to short cycle time is the length of time that the PET needs to be cooled in the mold following injection. If a preform comprising PET has not sufficiently cooled before it is ejected from the mandrel, it will become substantially crystalline and potentially cause difficulties during blow molding. Furthermore, if the virgin PET layer has not cooled enough before the overmolding process takes place, the force of the recycled PET entering the mold will wash away some of the virgin PET near the gate area. The preform design in FIG. 5 takes care of both problems by making the virgin PET layer thinnest in the center of the end cap region 42, which is where the gate is in the mold. The thin gate section allows the gate area to cool more rapidly, so that the virgin PET layer may be removed from the mold in a relatively short period of time while still avoiding crystallization of the gate and washing of the virgin PET during the second injection or overmolding phase.

Improving Mold Performance

As discussed above, the mold halves have an extensive cooling system comprising circulating coolant throughout the mold in order to conduct heat away and thus enhance the mold's heat absorption properties. With next reference to FIG. 16, which is a cross-section of a mold mandrel 298 and cavity 300, the mold cooling system can be optimized for the mold cavities by arranging cooling tubes 302 in a spiral around the mold cavity 300 and just below the surface 304. The rapid cooling enabled by such a cooling system helps avoid crystallization of the virgin PET layer during cooling. Also, the rapid cooling decreases the production cycle time by allowing injected preforms to be removed from the mold cavities quickly so that the mold cavity 300 may be promptly reused.

As discussed above, the gate area 306 of the mold cavity 300 is especially pivotal in determining cycle time. The void space near the gate 308, which will make up the molded preform's base end 304, receives the last portion of the melt stream to be injected into the mold cavity 300. Thus, this portion is the last to begin cooling. If the virgin PET layer has not sufficiently cooled before the overmolding process takes place, the force of the recycled material melt entering the mold may wash away some of the virgin PET near the gate area 308. To speed cooling in the gate area of the mold cavity in order to decrease cycle time, inserts 310 of an especially high heat transfer material such as ampcoloy can be disposed in the mold in the gate area 308. These ampcoloy inserts 310 will withdraw heat at an especially fast rate. To enhance and protect the ampcoloy inserts 310, a thin layer of titanium nitride or hard chrome may be deposited on the surface 312 of the ampcoloy to form a hard surface. Such a deposited surface would be preferably between only 0.001 and 0.01 inches thick and would most preferably be about 0.002 inches thick.

As discussed above, the mandrel 298 is especially important in the cooling process because it directly cools the inner, virgin PET layer. To enhance the cooling effect of the mandrel 298 on the inner surface of the preform and especially to enhance the cooling effect of the mandrel 298 at the preform's gate area/base end 314, the mandrel 298 is preferably substantially hollow, having a relatively thin uniform wall 320, as shown in FIG. 16. Preferably, this uniform thickness is between 0.1 inch and 0.3 inches and is most preferably about 0.2 inches. It is particularly important that the wall 320 at the base end 322 of the mandrel 298 is no thicker than the rest of the mandrel wall 314 because the thin wall aids in rapidly communicating heat away from the molten gate area 314 of the injected preform.

To further enhance the mandrel's cooling capability, cooling water may be supplied in a bubbler arrangement 330. A core tube 332 is disposed centrally in the mandrel 298 and delivers chilled coolant C to the base end 322 thereof. Since the base end 322 is the first point of the mandrel 298 contacted by this coolant C, the coolant is coldest and most effective at this location. Thus, the gate area 314 of the injected preform is cooled at a faster rate than the rest of the preform. Additionally, the mandrel 298 may also be constructed to be thinner at the base end 322 compared to the wall thickness of the remainder of the mandrel 298. This would provide an increased cooling effect at the gate area due to increased heat transfer at the base end 322 of the mandrel 298. Coolant injected into the mandrel at the base end 322 proceeds along the length of the mandrel 298 and exits through an output line 334. A plurality of ribs 336 are arranged in a spiral pattern around the core 332 to direct coolant C along the mandrel wall.

Another way to enhance cooling of the preform's gate area was discussed above and involves forming the mold cavity so that the inner, virgin PET layer is thinner at the gate area than at the rest of the injected preform as shown in FIG. 5. The thin gate area thus cools quickly to a substantially solid state and can be quickly removed from the first mold cavity, inserted into the second mold cavity, and have a layer of recycled PET injected thereover without causing washing of the virgin PET.

A Preferred Method and Apparatus for Warm-Fill or Hot-Fill Compatible Bottle

It is often desired to have the contents at an elevated temperature at the time of packaging, typically for pasteurization or sterility purposes. This is commonly referred to in the packaging industry as warm-fill or hot-fill. A warm-fill is defined as when the contents are above room temperature and up to 70° Celsius at the time of packaging. A hot-fill is when the contents are above 70° Celsius at the time of packaging. For all practical purposes, the upper limit for a hot-fill temperature is approximately 90° Celsius. Typical applications are for liquids composed primarily of water and any higher than a 90° Celsius fill temperature would be nearing the boiling point of the packaged product, which would not be feasible.

As mentioned previously, preforms made from virgin PET or a combination of virgin PET and recycled PET are typically desired to be amorphous in character, so as to be easily blow molded into a bottle. However, such an amorphous bottle may not withstand a warm-fill or hot-fill process while maintaining its dimensional stability due to the relatively low Tg of the PET material. Therefore, a method and apparatus for making a recycled-content plastic bottle that has the advantages of both the crystalline PET bottle and the amorphous or semi-crystalline PET bottle will now be disclosed. Additional details not necessary to repeat here are disclosed in applicant's copending application Ser. No. 09/844,820 entitled BOTTLES AND PREFORMS HAVING A CRYSTALLINE NECK FINISH filed Apr. 27, 2001, the entirety of which is hereby incorporated by reference.

By making at least part of the uppermost portion of the preform crystalline while keeping the body of the preform amorphous or semi-crystalline (sometimes referred to herein as "non-crystalline"), one can make a preform that will blow-mold easily yet retain necessary dimensions in the crucial neck finish area during a hot-fill process. To create generally crystalline and generally non-crystalline portions in the same preform, one needs to achieve different levels of heating and/or cooling in the mold in the regions from which crystalline portions will be formed as compared to those in which generally non-crystalline portions will be formed. The different levels of heating and/or cooling are preferably maintained by thermal isolation of the regions having different temperatures. This thermal isolation between the thread split, core and/or cavity interface can be accomplished utilizing low thermal conduct materials as inserts or separate components at the mating surfaces of these portions.

The cooling of the mold in regions which form preform surfaces for which it is preferred that the material be generally amorphous or semi-crystalline, is accomplished by chilled fluid circulating through the mold and core. In preferred embodiments, a mold set-up similar to that previously described is used, except that there is an independent fluid circuit, or heater, for the portions of the mold from which crystalline portions of the preform will be formed.

A mold configuration of a preferred embodiment is described in further detail with reference to FIG. 19, wherein a mandrel 298 and associated cavity 300 are shown. The cavity 300 is defined by the cavity half of the mold, which comprises a body mold 404 and a neck finish mold 402. A gate area of the cavity 300 is defined near a gate 308. An air insertion system 340 is provided in order to defeat a vacuum that may form between an injected preform and the cavity wall 304, which will be described in detail below.

As was the arrangement with the fully non-crystalline arrangement described above, here the mandrel 298 is also hollow and has a wall 320 of generally uniform thickness. A bubbler cooling arrangement 330 is disposed within the hollow mandrel 298 and comprises a core tube 332 located centrally within the mandrel 298 which delivers chilled coolant C directly to a base end 322 of the mandrel 298. Coolant C works its way up the mandrel from the base end 322 and exits through an output line 334. The core tube is held in place by ribs 336 extending between the tube and the mandrel wall 320.

As before, the body mold 404 has several cooling tubes 302 through which a chilled fluid, preferably water, is circulated. The neck finish mold 402 has several tubes 403 in which a fluid circulates. The fluid and circulation of tubes 403 and cooling tubes 302 are separate and independent. The coolant C circulating through the core section 400 is also separate from both tubes 403 and cooling tubes 302.

The thermal isolation of the body mold 404, neck finish mold 402 and core section 400 is achieved by use of inserts 406 having low thermal conductivity. However, materials having low thermal conductivity should not be used on the molding surfaces that contact the preform below the neck finish portion. In other words, where dimensional changes from blow-molding will occur. Examples of preferred low thermal conductivity materials include heat-treated tool steel (e.g. P-20, H-13, Stainless etc.), polymeric inserts of filled polyamides, nomex, air gaps and minimum contact shut-off surfaces.

In this independent fluid circuit through tubes 403, the fluid would be warmer than that used in the portions of the mold used to form non-crystalline portions of the preform. Preferred fluids include water, silicones, and oils.

In another embodiment, the portions of the mold which forms the crystalline portions of the preform, (corresponding to neck finish mold 402) contains a heating apparatus placed in the neck, neck finish, and/or neck cylinder portions of the mold so as to maintain the higher temperature (slower cooling) needed to promote crystallinity of the material during cooling. Such a heating apparatus includes, but is not limited to, heating coils, heating probes, and electric heaters, In other embodiments where greater crystallinity and less crystalline gradient is desired, molds which are modified as described above are paired with cores modified as follows. In the modified cores, the fluid circulation in the cores is modified such that, for the portions to form the crystalline preform parts, the fluid circulation is independent and at a relatively higher temperature, or the flow of chilled fluid is restricted or altered in these regions such that the temperature of the surface of the core in the portion which forms the crystalline portion of the preform is higher than that in the body regions. Alternatively, the relevant portions of the core may be heated other means as described above. Use of cores having these characteristics allows for a greater degree of crystallization towards and/or at the inner surface of the preform in the neck, neck finish and/or neck cylinder area and a lesser crystalline gradient between the inner surface and the outer surface in these areas.

In the first step, the virgin PET preform is injection molded by injecting molten PET into the cavities formed by the molds and cores in the mold stack. When the cavity is filled, the resin in the body portion will come into contact with cooling surfaces and the resin in the neck finish will come into contact with the heated thread mold. As the PET in the neck finish cools, it will begin to crystallize as a result of this contact with the relatively hot mold. Once in contact, the crystallization will start and continue at a rate determined by time and temperature. When the neck finish portion of the molds are kept above the minimum temperature of crystallization of the PET used, crystallization will begin on contact. Higher temperatures will increase the rate of crystallization and decrease the time required to reach the optimum level of crystallization while maintaining post mold dimensional stability of the neck finish of the preform. At the same time the resin in the neck finish portion is cooling into a crystallized state, the resin in the body portion or lower body portion of the preform will be in contact with the chilled portions of the mold and thus cooled into an amorphous or semi-crystalline state.

For a monolayer preform, the process would essentially stop at this point, with the preform being removed from the mold when it has been adequately cooled and hardened to be removed from the mold and processed or handled further. For a multi-layer preform, as shown in FIG. 4, the process would continue with the injection of a second layer, preferably a post-consumer recycled material layer, as discussed above. The inject over inject method of making a multi-layer preform allows the exposure time of two injection molding cycles, the molding of the substrate and the over molding of the second layer. Therefore, although the initial virgin PET preform is removed from the mold earlier than in a monolayer context, there is still sufficient crystallization time within the normal molding cycle as an integrated operation with no secondary steps because the neck finish is still in contact with the warm surfaces promoting crystallization throughout the entire two injection cycle. Injection speed, pressure and relative wall thickness of the finish will also affect the time required to reach the optimum level and depth of the crystallized neck finish and/or surrounding areas as desired.

The process using modified molds and chilled cores will produce a unique combination of amorphous/crystalline properties. As the core is chilled and the thread mold is heated, the thermal transfer properties of the PET act as a barrier to heat exchange. The heated thread molds crystallize the virgin PET at the surface of the thread finish, and the virgin PET material transitions into an amorphous form near the core as the temperature of the virgin PET reduces closer to the core. This variation of the material from the inner (core) portion to the outer (thread) portion is also referred to herein as the crystallinity gradient.

The core temperature and the rate of crystallization of the resin play a part in determining the depth of crystallized resin. In addition, the amorphous inner surface of the neck finish stabilizes the post mold dimensions allowing closer molding tolerances than other crystallizing processes. On the other side, the crystallized outer surface supports the amorphous structure during high temperature filling of the container. Physical properties are also enhanced (e.g. brittleness, impact etc.) as a result of this unique crystalline/amorphous structure.

The optimum temperature for crystallization may vary depending upon factors including resin grade, resin crystallization temperature, intrinsic viscosity, wall thickness, exposure time, mold temperature. Preferred resins include PET homopolymer and copolymers (including but not limited to high-IPA PET, copolymers of PET and polyamides)

and PEN. Such resins preferably have low intrinsic viscosities and moderate melt temperatures, preferably IVs of about 0.74 to 0.80, and melt temperatures of about 220–300° C. The preferred mold temperature range for the desired crystalline portion of the preform is from about 140–200° C., with the maximum crystallization rate occurring at about 180° C., depending upon the above factors, the preferred exposure time range is from about 20 to 60 seconds overall, which includes both injection steps in inject-over-inject embodiments, and the preferred injection pressure range is about 5000 to 22,000 PSI. Thicker finish wall thickness will require more time to achieve a particular degree of crystallinity as compared to that needed for a thinner wall thickness. Increases in exposure time (time in mold) will increase the depth of crystallinity and the overall percentage of crystallinity in the area, and changes in the mold temperature in the region for which crystallinity is desired will affect the crystallinity rate and dimensional stability.

Further Mold Improvements

In the continuing effort to reduce cycle time, injected preforms are removed from mold cavities as quickly as possible. However, it may be appreciated that the newly injected material is not necessarily fully solidified when the injected preform is removed from the mold cavity. This results in possible problems removing the preform from the cavity 300. Friction or even a vacuum between the hot, malleable plastic and the mold cavity surface 304 can cause resistance resulting in damage to the injected preform when an attempt is made to remove it from the mold cavity 300.

Typically, mold surfaces are polished and extremely smooth in order to obtain a smooth surface of the injected part. However, polished surfaces tend to create surface tension along those surfaces. This surface tension may create friction between the mold and the injected preform which may result in possible damage to the injected preform during removal from the mold. To reduce surface tension, the mold surfaces are preferably treated with a very fine sanding device, preferably a draw stone, to slightly roughen the surface of the mold. Preferably, the stone has a grit rating between about 400 and 700. More preferably, a 600 grit draw stone is used. Also, the mold is preferably sanded in only a longitudinal direction, further facilitating removal of the injected preform from the mold. Alternatively, or additionally, the surface of the mold may be vapor honed in order to achieve the desired surface finish.

During injection, air is pushed out of the mold cavity 300 by the injected meltstream. As a result, a vacuum may develop between the injected preform and the mold cavity wall 304. When the injected preform is removed from the cavity 300, the vacuum may resist removal, resulting in damage to the not-fully-solidified preform. To defeat the vacuum, an air insertion system 340 may be employed. With additional reference to FIGS. 17 and 18, an embodiment of an air insertion system 340 is provided. At a joint 342 of separate members of the mold cavity 300, a notch 344 is preferably formed circumferentially around and opening into the mold cavity 300. The notch 344 is preferably formed by a step 346 of between 0.002 inches and 0.005 inches and most preferably about 0.003 inches in depth. Because of its small size, the notch 344 will not fill with plastic during injection but will enable air A to be introduced into the mold cavity 300 to overcome the vacuum during removal of the injected preform from the mold cavity 300. An air line 350 connects the notch 344 to a source of air pressure and a valve (not shown) controls the supply of air A. During injection, the valve is closed so that the melt fills the mold cavity 300 without air resistance. When injection is complete, the valve opens and a supply of air is delivered to the notch 344 at a pressure between about 75 psi and 150 psi and most preferably about 100 psi. The supply of air defeats any vacuum that may form between the injected preform and the mold cavity, aiding removal of the preform. Although the drawings show only a single air supply notch 344 in the mold cavity 300, any number of such notches may be provided and in a variety of shapes depending on the size and shape of the mold. Additionally, a plurality of entire air insertion systems similar to that just described may be utilized to provide additional protection from damage to the preform resulting from a vacuum condition. Also, an air insertion system 340 may be utilized specifically in the thread mold 402 for the reasons as described above.

While some of the above-described improvements to mold performance are specific to the method and apparatus described herein, those of skill in the art will appreciate that these improvements may also be applied in many different types of plastic injection molding applications and associated apparatus. For instance, use of ampcoloy in a mold may quicken heat removal and dramatically decrease cycle times for a variety of mold types and melt materials. Also, roughening of the molding surfaces and provides air pressure supply systems may ease part removal for a variety of mold types and melt materials.

Formation of Preferred Containers by Blow Molding

The multi-layer containers preferably produced by blow-molding the multi-layer preforms, the creation of which is disclosed above. The multi-layer preforms can be blow-molded using techniques and conditions very similar, if not identical, to those by which single-layer, virgin (monolayer) PET preforms are blown into containers. Such techniques and conditions for blow-molding monolayer PET preforms into bottles are well known to those skilled in the art and can be used or adapted as necessary.

Generally, in such a process, the preform is heated to a temperature of preferably 80 to 120° C., more preferably 100 to 105° C., and given a brief period of time to equilibrate. After equilibration, it is stretched to a length approximating the length of the final container. Following the stretching, pressurized air is forced into the preform which acts to expand the walls of the preform to fit the mold in which it rests, thus creating the container.

It may also be desirable to additionally heat-set the now blow-molded bottles. Such a method is well known to those skilled in the art and has the advantage of producing a thermally stable bottle. After the blow molding process, the formed bottle is held in a "hot" mold (approximately 80–90° Celsius) in order to induce thermal relaxation of the bottle wherein small molecule crystalline growth is achieved. Such a bottle is capable of fill temperatures of approximately 60–90° Celsius and may be used with a non-crystalline preform or with a preform having crystalline and amorphous/non-crystalline regions, as discussed above.

Formation of a Barrier Enhanced Container

As discussed earlier, good gas barrier properties may be preferred when a container constructed in accordance with preferred embodiments is to be used in the packaging of carbonated beverages. A barrier layer preserves the carbonation of the bottled beverage by inhibiting the egress of carbon dioxide and helps in preserving the flavor of the beverage by inhibiting the ingress of oxygen.

In one alternative, a gas barrier layer may be provided by overmolding, or inject-over-inject (IOI), technology as disclosed in applicant's copending application entitled APPARATUS AND METHOD FOR MAKING A BARRIER-COATED POLYESTER, application Ser. No. 09/296,695, filed Apr. 21, 1999, the entirety of which is hereby incorporated by reference. Additionally, a gas barrier layer may be applied to the preform or finished container by any suitable method known in the art, such as spraying or vapor deposition. Advantageously, a multi-layer container produced by IOI process is able to resist warping or delamination due to the heat or vacuum conditions imposed by the barrier layer application process.

A preferred method of providing a barrier layer is through Plasma-Enhanced Chemical Vapor Deposition (PECVD), a technique in which a gas barrier film is deposited onto a substrate. The process generally comprises introducing the desired barrier material in gas form near the substrate and adding energy until the barrier gas disassociates into a plasma state. A vacuum condition may be present to allow the process to take place at temperatures low enough to prevent thermal damage to the substrate. The disassociated particles solidify upon striking the substrate, due to a sudden loss of energy, and create the barrier layer. Additionally, other suitable types of deposition processes may be employed to apply a barrier coating to the container.

The barrier coating is preferably deposited on the inside of a container formed by the process described above. However, an external barrier coating may also be provided. Additionally, it is preferred to provide a silicon oxide barrier film to the container, although other types of films, such as those produced by utilizing acetylene or a number of epoxy thermoset materials, may be used.

Manufacturing equipment for performing the barrier coating process may be purchased through a number of companies. For example, the following companies manufacture commercial barrier coating equipment (followed by the trade name designated by each company for their respective barrier coating equipment and/or process, if any): Sidel (ACTIS), Krones/Leybold (BestPet), Tetra Pak (Glaskin), Nissei, and PPG (Bairocade).

As described above, multi-layer preforms and containers created by conventional processes often experience delamination or warping due to the thermal or vacuum conditions of barrier coating processes. This has inhibited the incorporation of recycled materials in applications where barrier properties are desired. However, a preform or container created by a preferred IOI process has improved interlayer adhesion such that the preform or container is able to withstand coating processes without the warping or delamination associated with conventional multi-layer articles. Thus, incorporation of recycled material and good gas barrier properties in a single article becomes commercially feasible.

Although the present invention has been described in terms of certain preferred embodiments, and certain exemplary methods, it is to be understood that the scope of the invention is not to be limited thereby. Instead, Applicant intends that the scope of the invention be limited solely by reference to the attached claims, and that variations on the methods and materials disclosed herein which are apparent to those of skill in the art will fall within the scope of Applicant's invention.

What is claimed is:

1. A preform comprising:
   a single layer threaded neck finish comprising virgin polyester;
   a body portion including an end cap, the body portion comprising a first layer and a second layer, the first layer comprising virgin polyester and the second layer comprising recycled polyester;
   wherein the second layer comprises about 25% to about 50% of the preform.

2. A preform according to claim 1, wherein the first layer is selected from the group consisting of PET homopolymers and copolymers, polyethylene naphthalate, polyethylene naphthalate copolymers, polyethylene naphthalate/polyethylene terephtalate blends, and combinations thereof.

3. A preform according to claim 1, wherein the second layer is selected from the group consisting of recycled PET homopolymers and copolymers, recycled polyethylene naphthalate, recycled polyethylene naphthalate copolymers, recycled polyethylene naphthalate/polyethylene terephthalate blends, and combinations thereof.

4. A preform according to claim 1, wherein the second layer comprises recycled PET, the recycled PET being a product of a recycling process for barrier containers made of PET and hydroxy-phenoxyether polymers, the process comprising:
   chopping the containers into smaller pieces;
   cleaning the pieces;
   dissolving the hydroxy-phenoxyether polymer with acid;
   separating the hydroxy-phenoxyether polymer solution from the PET pieces;
   rinsing and drying the PET pieces.

5. A preform comprising:
   a first layer comprising virgin PET having an isophthalic acid content of at least about 2% by weight;
   a second layer comprising recycled PET;
   wherein the first layer is thinner in an end cap than in a wall portion and the second layer is thicker in the end cap than in the wall portion; and
   wherein the second layer comprises about 25% to about 50% of the preform.

6. The preform of claim 5, wherein the recycled PET comprises about 25% to about 50% of the preform.

7. A preform comprising:
   a threaded neck finish, a neck cylinder and a body portion, the body portion additionally comprising an end cap;
   the neck finish, the neck cylinder and the body portion comprising a first layer of virgin polyester and the body portion additionally comprising a second layer of recycled polyester, the second layer comprising about 25% to about 50% of the preform;
   wherein each of the first layer and the second layer are formed by injection molding.

8. A preform according to claim 7, wherein the first layer is selected from the group consisting of PET homopolymers and copolymers, polyethylene naphthalate, polyethylene naphthalate copolymers, polyethylene naphthalate/polyethylene terephthalate blends, and combinations thereof.

9. A preform according to claim 7, wherein the second layer is selected from the group consisting of recycled PET homopolymers and copolymers, recycled polyethylene naphthalate, recycled polyethylene naphthalate copolymers, recycled polyethylene naphthalate/polyethylene terephthalate blends, and combinations thereof.

10. A preform according to claim 7, wherein the body portion is primarily amorphous or semi-crystalline, and the threaded neck finish is primarily crystalline.

11. A preform according to claim 10, wherein the interior surface of the threaded neck finish is amorphous.

12. A preform according to claim 7, wherein the second layer comprises recycled PET, the recycled PET being a product of a recycling process for barrier containers made of PET and hydroxy-phenoxyether polymers, the process comprising:

chopping the containers into smaller pieces;

cleaning the pieces;

dissolving the hydroxy-phenoxyether polymer with acid;

separating the hydroxy-phenoxyether polymer solution from the PET pieces;

rinsing and drying the PET pieces.

13. The preform of claim 1, wherein the body portion additionally comprises a third layer, the third layer comprising a gas barrier material.

14. The preform of claim 13, wherein the gas barrier material is a material selected from the group of silicone oxide films, copolyester barrier materials, phenoxy-type thermoplastics, polyamides, polyamide blends, polyethylene naphthalate, polyethylene naphthalate copolymers, polyethylene naphthalate/polyethylene terephthalate blends, and combinations thereof.

15. The preform of claim 1, wherein the first layer defines a portion of an inner surface of the perform.

16. A preform comprising:

a single layer threaded neck finish comprising virgin polyester;

a body portion including an end cap, the body portion comprising a first layer, a second layer, and a third layer, wherein the first layer comprising virgin polyester, the second layer comprising recycled polyester, and the third layer comprising phenoxy-type thermoplastic.

17. A preform according to claim 16, wherein the recycled polyester comprises about 25% to about 50% of the preform.

18. A preform according to claim 16, wherein the first layer is selected from the group consisting of PET homopolymers and copolymers, polyethylene naphthalate, polyethylene naphthalate copolymers, polyethylene naphthalate/polyethylene terephthalate blends, and combinations thereof.

19. A preform according to claim 16, wherein the second layer is selected from the group consisting of recycled PET homopolymers and copolymers, recycled polyethylene naphthalate, recycled polyethylene naphthalate copolymers, recycled polyethylene naphthalate/polyethylene terephthalate blends, and combinations thereof.

20. A preform according to claim 16, wherein the second layer comprises recycled PET, the recycled PET being a product of a recycling process for barrier containers made of PET and hydroxy-phenoxyether polymers, the process comprising:

chopping the containers into smaller pieces;

cleaning the pieces;

dissolving the hydroxy-phenoxyether polymer with acid;

separating the hydroxy-phenoxyether polymer solution from the PET pieces;

rinsing and drying the PET pieces.

21. A preform according to claim 20, wherein the interior surface of the threaded neck finish is amorphous.

22. A preform according to claim 16, wherein the body portion is primarily amorphous or semi-crystalline, and the threaded neck finish is primarily crystalline.

* * * * *